US012668889B2

(12) United States Patent
Singh et al.

(10) Patent No.: US 12,668,889 B2
(45) Date of Patent: Jun. 30, 2026

(54) RARE-EARTH ION DOPED THIN FILM TECHNOLOGIES

(71) Applicant: THE UNIVERSITY OF CHICAGO, Chicago, IL (US)

(72) Inventors: Manish Singh, Chicago, IL (US); Tian Zhong, Chicago, IL (US); Supratik Guha, Chicago, IL (US)

(73) Assignee: THE UNIVERSITY OF CHICAGO, Chicago, IL (US)

( * ) Notice: Subject to any disclaimer, the term of this patent is extended or adjusted under 35 U.S.C. 154(b) by 1230 days.

(21) Appl. No.: 17/434,221

(22) PCT Filed: Mar. 5, 2020

(86) PCT No.: PCT/US2020/021257
§ 371 (c)(1),
(2) Date: Aug. 26, 2021

(87) PCT Pub. No.: WO2020/181131
PCT Pub. Date: Sep. 10, 2020

(65) Prior Publication Data
US 2022/0136133 A1 May 5, 2022

Related U.S. Application Data

(60) Provisional application No. 62/838,126, filed on Apr. 24, 2019, provisional application No. 62/814,187, filed on Mar. 5, 2019.

(51) Int. Cl.
*C30B 23/02* (2006.01)
*C30B 29/16* (2006.01)
(Continued)

(52) U.S. Cl.
CPC .............. *C30B 23/02* (2013.01); *C30B 29/16* (2013.01); *C30B 29/32* (2013.01); *C30B 33/08* (2013.01);
(Continued)

(58) Field of Classification Search
CPC ......... C30B 33/08; C30B 29/16; C30B 23/02; C30B 29/32; H01F 10/126; H01F 41/302; H10D 48/3835; B82Y 40/00; B82Y 10/00
See application file for complete search history.

(56) References Cited

U.S. PATENT DOCUMENTS 5,314,547 A 5/1994 Heremans
5,491,461 A * 2/1996 Partin .................... H10N 50/10
324/207.21
(Continued)

FOREIGN PATENT DOCUMENTS

CN 107134515 A * 9/2017 ......... H10H 20/8252
JP 2012104738 A * 5/2012
KR 101526546 B1 * 6/2015

OTHER PUBLICATIONS

Supplementary European Search Report in EP20765570, dated Oct. 14, 2022.
(Continued)

*Primary Examiner* — Michael M Dollinger
(74) *Attorney, Agent, or Firm* — Barnes & Thornburg LLP

(57) ABSTRACT

The present disclosure includes a thin film assembly comprising a substrate and an epitaxial crystalline thin film disposed on the substrate, wherein the epitaxial crystalline thin film is a single crystal, wherein at least a portion of the epitaxial crystalline thin film is doped with rare-earth ions at a concentration of less than 100 parts per billion. The disclosure further includes a method of manufacturing a thin film assembly, the method comprising creating, on a sub-
(Continued)

100

108
106
104
102 strate and with use of molecular beam epitaxy, an epitaxial crystalline thin film doped with the rare-earth ions at a concentration of less than 100 parts per billion.

8 Claims, 17 Drawing Sheets

(51) Int. Cl.

| | | |
|---|---|---|
| *C30B 29/32* | (2006.01) | |
| *C30B 33/08* | (2006.01) | |
| *H01F 10/12* | (2006.01) | |
| *H01F 41/30* | (2006.01) | |

(52) U.S. Cl.
CPC ......... *H01F 10/126* (2013.01); *H01F 41/302* (2013.01)

(56) References Cited

U.S. PATENT DOCUMENTS

| | | | | |
|---|---|---|---|---|
| 5,883,564 | A * | 3/1999 | Partin | H10N 52/101 |
| | | | | 257/E43.003 |
| 6,642,539 | B2 | 11/2003 | Ramesh et al. | |
| 8,492,245 | B1 * | 7/2013 | Lagally | H01L 21/02664 |
| | | | | 438/479 |
| 2005/0195472 | A1 * | 9/2005 | Tang | H01S 3/0632 |
| | | | | 359/333 |
| 2006/0118824 | A1 * | 6/2006 | Otsuka | H10D 30/4755 |
| | | | | 257/E29.253 |
| 2008/0232761 | A1 | 9/2008 | Kumaran et al. | |
| 2009/0114832 | A1 * | 5/2009 | Lynn | G01T 1/24 |
| | | | | 250/371 |
| 2010/0065815 | A1 | 3/2010 | Bojarczuk et al. | |
| 2010/0276664 | A1 * | 11/2010 | Hersee | H01L 21/02636 |
| | | | | 257/15 |
| 2010/0308375 | A1 * | 12/2010 | Birkhahn | H10D 30/015 |
| | | | | 257/E21.403 |
| 2013/0032759 | A1 * | 2/2013 | Riman | C09K 11/7772 |
| | | | | 252/301.36 |
| 2014/0191240 | A1 * | 7/2014 | Chiang | H01L 21/31111 |
| | | | | 438/285 |
| 2014/0231818 | A1 * | 8/2014 | Arkun | H01L 21/0254 |
| | | | | 438/478 |
| 2016/0089723 | A1 * | 3/2016 | Jung | B82Y 40/00 |
| | | | | 204/192.34 |
| 2019/0013200 | A1 * | 1/2019 | Lagally | H10F 77/1465 |

OTHER PUBLICATIONS

PCT Search Report prepared for PCT/US2020/021257, completed May 4, 2020.
Dhar, S., et al., "Colossal Magnetic Moment of Gd in GaN;" 2005; Physical Review Letters; American Physical Society; vol. 94; Nr: 3; p. 55.
XP055735245; "Strontium Titanate;" 2020.
XP055735248; "Indium Antimonide;" 2020.
XP055627906; "Gallium Nitride—Wikipedia;" 2019.
XP055718421; "Molecular-Beam Epitaxy—Wikipedia;" 2020.
XP055735252; "EddyPro Units—Distinguishing Between Molar Density, Mole Fraction, and Mixing Ratio;" 2020.

* cited by examiner

300

302
PREPARE SUBSTRATE
304
CLEAN SUBSTRATE
306
HEAT SUBSTRATE IN VACUUM

308
GROW DOPED THIN FILM USING MOLECULAR BEAM EPITAXY
310
SUPPLY OXYGEN FROM RF PLASMA SOURCE
312
SUPPLY HOST ATOMS IN EFFUSION CELL AND DOPANT ATOMS IN EFFUSION CELL

316
MONITOR THIN FILM GROWTH
318
MONITOR THIN FILM GROWTH WITH RHEED

320
FILM AT DESIRED THICKNESS?

322
END EPITAXIAL GROWTH

1200

1202
PREPARE SUBSTRATE

1204
CLEAN SUBSTRATE

1206
HEAT SUBSTRATE IN VACUUM

1208
GROW FIRST BUFFER THIN FILM USING MOLECULAR BEAM EPITAXY

1210
SUPPLY OXYGEN FROM RF PLASMA SOURCE

1212
SUPPLY HOST ATOMS IN EFFUSION CELL

1214
MONITOR FIRST BUFFER THIN FILM GROWTH

1216
MONITOR THIN FILM GROWTH WITH RHEED

1218
FIRST BUFFER FILM AT DESIRED THICKNESS?

D    TO FIG. 13

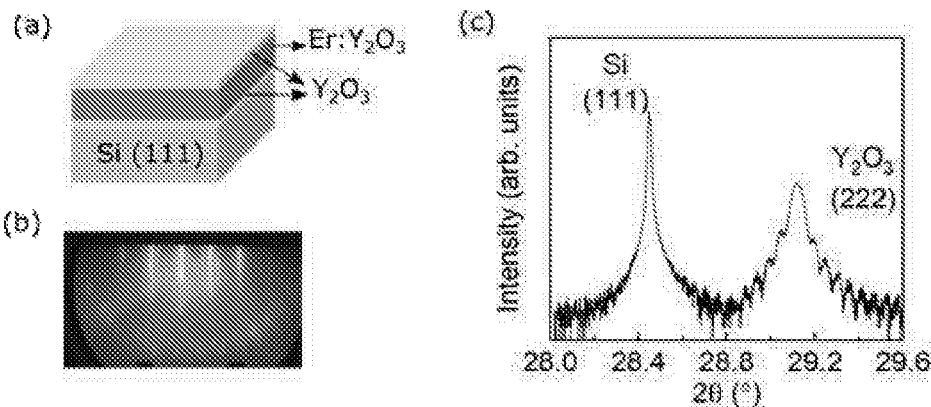

FIG. 15. (a) Schematic of the film for which the data is shown, (b) shows the streaky RHEED pattern following the end of growth, indicating smooth and crystalline film. (c) XRD pattern showing the substrate Si (111) and film $Y_2O_3$ (222) peaks.

FIGS. 15A-15C

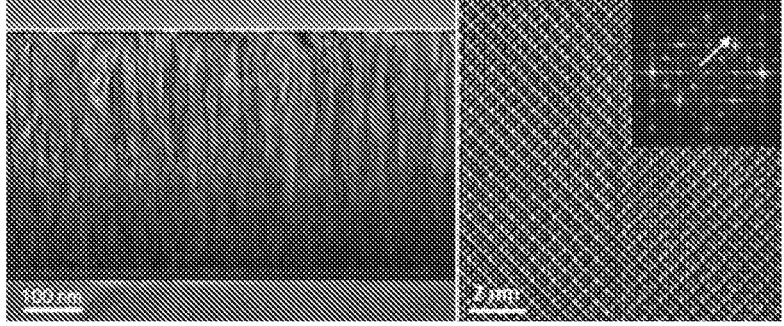

FIG. 16. (a) Cross-sectional TEM of a 460 nm film grown at 920 °C (growth time = 80 min). The interfacial layer is visible. (b) A high-resolution TEM image showing $Y_2O_3$ film with a coincidence boundary. The inset shows diffraction pattern (arrow points in the 400 direction) confirming the bixbyite structure.

FIGS. 16A-16B

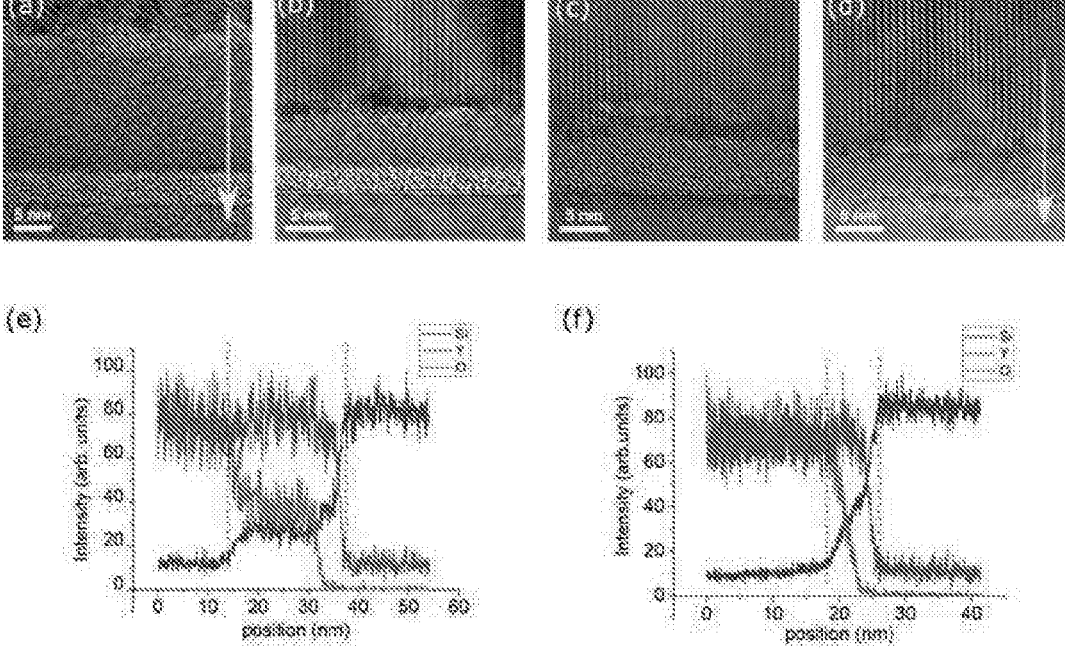

FIG. 17. Cross-sectional TEM showing the interface for four different conditions of temperature ($T$) and time ($t$). Thickness of amorphous layer seen between crystalline $Y_2O_3$ and $SiO_2$ can be directly estimated from the TEM (a) 24 nm for $T$ = 920 °C, $t$ = 80 min (b) 8 nm for $T$ = 850 °C, $t$ = 80 min (c) 5 nm for $T$ = 790 °C, $t$ = 60 min (d) 5 nm for $T$ = 790 °C, $t$ = 180 min. The EDS of the interface for (a) and (d) is given in figure (e) and (f) respectively. The direction of the EDS scan is represented by the yellow arrow. Dotted lines in (e) and (f) demarcate the amorphous region.

FIGS. 17A-17F

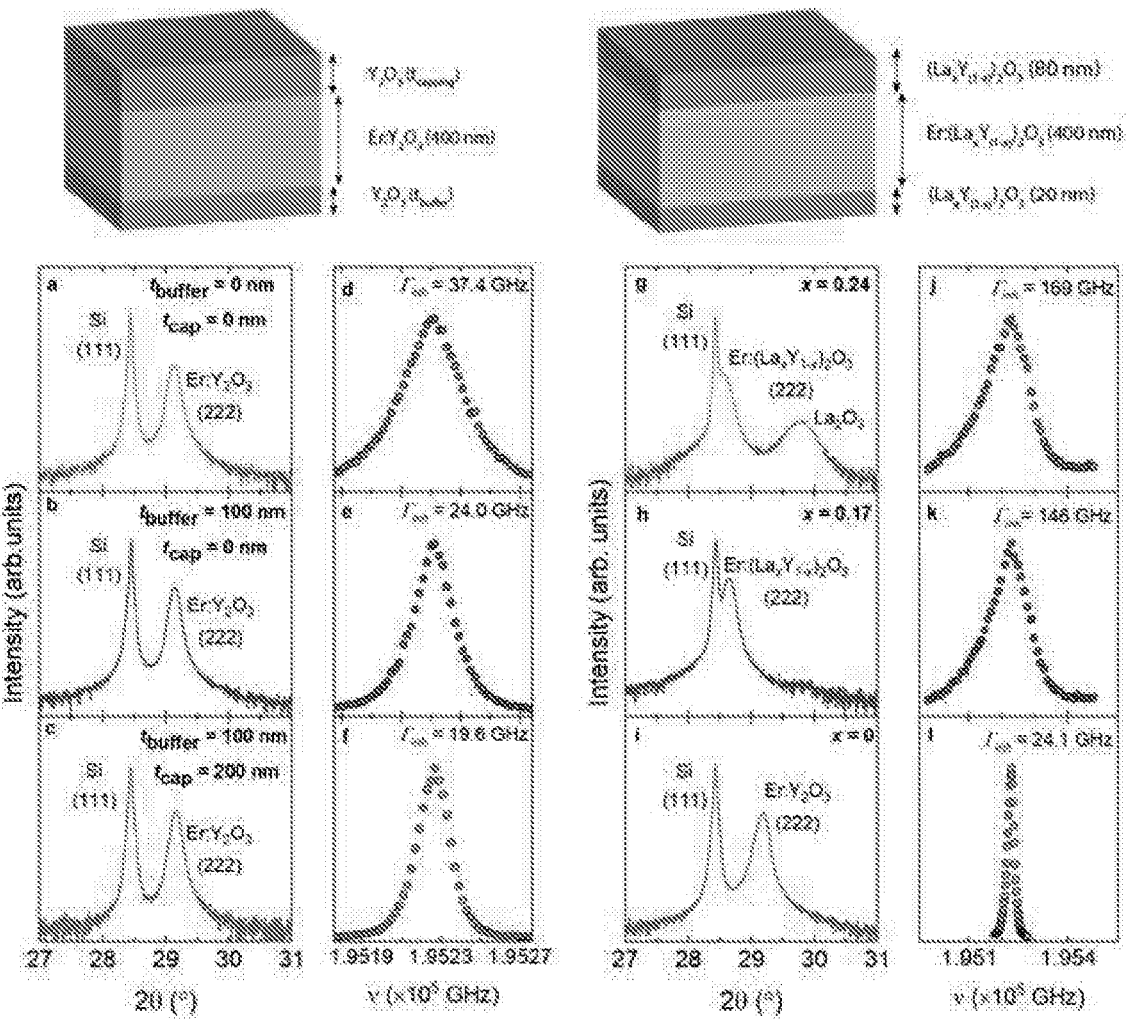

FIG. 18. The schematic at the top left represents the structure $(Y_2O_3)/(Er:Y_2O_3)/(Y_2O_3)$ used to probe the effect of the interface. (a-c) The XRD curve for the three films suggest similar crystal quality, (d) The baseline linewidth with no cap or buffer layer gives a $\Gamma_{inh}$ of 37.4 GHz. (e) The addition of a bottom undoped layer improves this to 24.0 GHz. Further adding a top undoped layer improves the linewidth to 19.6 GHz (f) giving an improvement of almost 50% over the baseline. On the top right the schematic represents the structure (20 nm $Y_2O_3$)/(400 nm Er:$(La_xY_{(1-x)})_2O_3$)/(80 nm $Y_2O_3$) used to study the effect of the La alloying of $Y_2O_3$. The improvement in lattice match is clearly indicated by the shift in film XRD peak to Si (g-i). However, the inhomogeneous optical linewidth also broadens as more La is added (j-l).

FIGS.
18A-18L

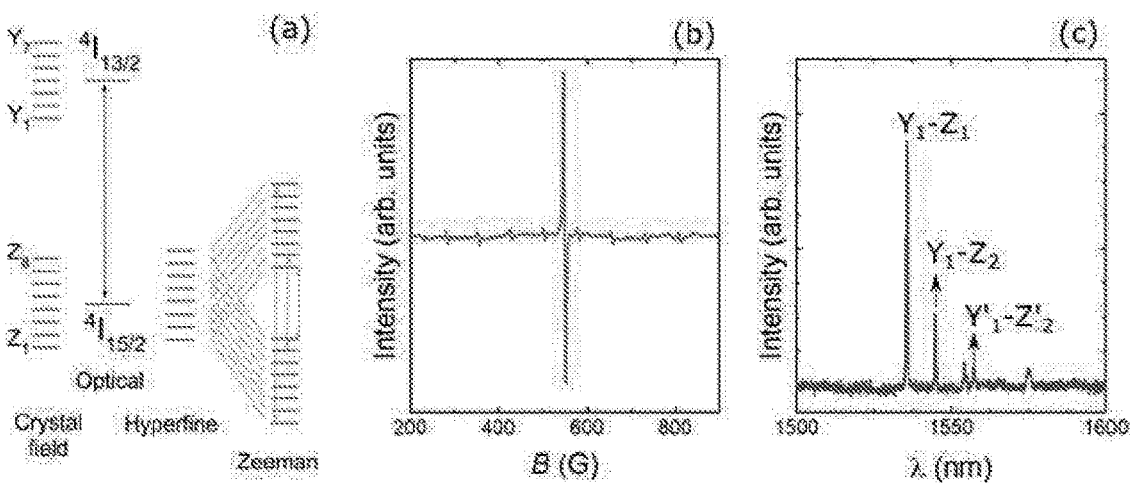

FIG. 19. (a) A schematic of the energy levels of interest in the $Er^{3+}$ - Stark levels from the crystal field effect (emission spectra) and the Zeeman splitting of the hyperfine levels which is seen in EPR. . (b) EPR spectra shows a large central peak from the zero nuclear spin isotopes of Er. Eight smaller peaks from the hyperfine transitions contributed by [167]Er are also seen. (c) Photoluminescence spectra from $Er:Y_2O_3$ films. Contribution from $C_2$ and $C_{3i}$ sites are identified by the energies reported in literature. This confirms the substitution of $Er^{3+}$ for $Y^{3+}$ in the bixbyite structure.

FIGS. 19A-19C

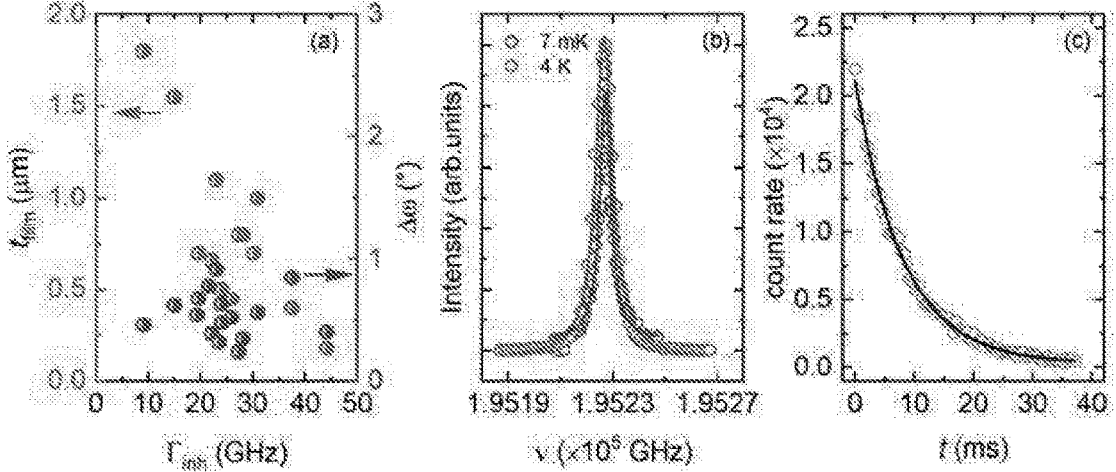

FIG. 20. (a) A strong linear correlation is seen between PL linewidth and the film thickness (red), a comparison of the two metrics of disorder in the crystal quality, optical inhomogeneous linewidth (y-axis) and rocking curve FWHM (x-axis) however, shows no correlation (blue). (b) The narrowest linewidth obtained in our samples is 7.9 GHz at 4K (red) and 5.1 GHz in the same sample in a dilution fridge setup (blue) (c) Optical excitation decay rate at the $C_2$ site was measured as 8.1 ms

FIGS. 20A-20C

RARE-EARTH ION DOPED THIN FILM TECHNOLOGIES

CROSS-REFERENCE TO RELATED APPLICATIONS

The present application is a national stage entry under 35 U.S.C. § 371(b) of PCT International Application No. PCT/US2020/021257, filed Mar. 5, 2020, which claims the benefit of U.S. provisional patent application No. 62/814,187, filed Mar. 5, 2019, and claims the benefit of U.S. provisional patent application No. 62/838,126, filed Apr. 24, 2019. The entirety of all of these applications are incorporated herein by reference.

GOVERNMENT LICENSE RIGHTS

This invention was made with Government support under grant number 1843044 awarded by the National Science Foundation, and grant numbers DE-AC02-05CH11231 and DE-AC02-06CH11357 awarded by the Department of Energy. The Government has certain rights in this invention.

BACKGROUND

Quantum information processing promises advances in communication and computing, as well as an improved understanding of fundamental physics. One useful resource for quantum information processing would be a system that simultaneously possesses long coherence times and narrow optical transitions, while allowing for chip-scale integration with photonics. Atom-like solid-state emitters such as semiconductor quantum dots and color centers in diamond have useful properties, but influences from their host matrices still impose significant limitations on their coherence properties.

Rare-earth (RE) ions such as erbium in solids feature numerous 4f-intra-shell transitions that are effectively shielded from their crystalline surroundings by closed outer shells, allowing for long spin coherence times (up to 6 hours) and narrow optical transitions (<100 Hz). Recent ensemble experiments have established the rare-earth doped crystals as the leading materials for optical quantum memories. However, the development of large-scale quantum devices based on rare-earth doped materials has remained a challenge.

SUMMARY

An apparatus, system, or method may comprise one or more of the features recited in the appended claims and/or the following features which, alone or in any combination, may comprise patentable subject matter:

According to one aspect of the disclosure, an epitaxial crystalline thin film assembly comprising a substrate; and a epitaxial crystalline thin film disposed on top of the substrate, wherein the epitaxial crystalline thin film is a single crystal, wherein at least a portion of the epitaxial crystalline thin film is doped with rare-earth ions at a concentration of less than 100 parts per billion.

In some embodiments, the epitaxial crystalline thin film comprises a first undoped buffer epitaxial crystalline thin film on top of the substrate, wherein the first undoped buffer epitaxial crystalline thin film is at least 1 nanometer thick; a doped epitaxial crystalline thin film on top of the first undoped buffer epitaxial crystalline thin film, wherein the doped epitaxial crystalline thin film is doped with the rare-earth ions at a concentration of less than 100 parts per billion; and a second undoped buffer epitaxial crystalline thin film on top of the doped epitaxial crystalline thin film, wherein the second undoped buffer epitaxial crystalline thin film is at least 1 nanometer thick.

In some embodiments, the epitaxial crystalline thin film has a thickness between 30 nanometers and 1,500 nanometers.

In some embodiments, the epitaxial crystalline thin film has a thickness less than two microns.

In some embodiments, the epitaxial crystalline thin film is less than 1% rare-earth dopant.

In some embodiments, the doped epitaxial crystalline thin film comprises a plurality of doped regions, wherein each of the plurality of doped regions is separated from each other of the plurality of doped regions by at least 100 nm.

In some embodiments, the substrate is silicon, wherein epitaxial crystalline thin film is yttrium oxide, wherein the rare-earth ions are erbium.

In some embodiments, at least one erbium atom in the epitaxial crystalline thin film is at least 100 nanometers away from any other erbium atom.

In some embodiments, the rare-earth ions are europium, praseodymium, neodymium, or ytterbium.

In some embodiments, at least one erbium atom in the epitaxial crystalline thin film is at least 100 nanometers away from any other rare-earth dopant.

In some embodiments, the epitaxial crystalline thin film is one of strontium titanate.

In some embodiments, the epitaxial crystalline thin film assembly is integrated into one of a quantum memory device, a quantum information processing device, a quantum electronic device, and a photonic device.

According to one aspect of the disclosure, a method of manufacturing a epitaxial crystalline thin film assembly, the method comprising creating, on a substrate and with use of molecular beam epitaxy, a epitaxial crystalline thin film doped with the rare-earth ions at a concentration of less than 100 parts per billion.

In some embodiments, creating the epitaxial crystalline thin film comprises creating, with use of molecular beam epitaxy, a first undoped buffer epitaxial crystalline thin film that is at least 1 nanometer thick and that is on top of the substrate; creating, with use of molecular beam epitaxy, a doped epitaxial crystalline thin film on top of the first undoped buffer epitaxial crystalline thin film with a doping concentration of the rare-earth ions of less than 100 parts per billion; and creating, with use of molecular beam epitaxy, a second undoped buffer epitaxial crystalline thin film that is at least 1 nanometer thick and that is on top of the doped epitaxial crystalline thin film.

In some embodiments, the epitaxial crystalline thin film has a thickness between 30 nanometers and 1,500 nanometers.

In some embodiments, the epitaxial crystalline thin film has a thickness less than two microns.

In some embodiments, the epitaxial crystalline thin film is less than 1% rare-earth dopant.

In some embodiments, the doped epitaxial crystalline thin film comprises a plurality of doped regions, wherein each of the plurality of doped regions is separated from each other of the plurality of doped regions by at least 100 nm.

In some embodiments, creating the epitaxial crystalline thin film comprises creating, with use of molecular beam epitaxy, a first undoped buffer epitaxial crystalline thin film that is at least 1 nanometer thick and that is on top of the substrate; creating, with use of molecular beam epitaxy, a doped epitaxial crystalline thin film on top of the first undoped buffer epitaxial crystalline thin film with a doping concentration of the rare-earth ions of less than 100 parts per billion; applying a mask on top of the doped epitaxial crystalline thin film, wherein the mask covers a first portion of the doped epitaxial crystalline thin film and does not cover a second portion of the doped epitaxial crystalline thin film; etching the second portion of the doped epitaxial crystalline thin film while the mask covers the first portion of the doped epitaxial crystalline thin film; removing the mask; and creating, with use of molecular beam epitaxy, a second undoped buffer epitaxial crystalline thin film that is at least 1 nanometer thick and that is on top of the first portion of the doped epitaxial crystalline thin film and on top of the first undoped buffer epitaxial crystalline thin film.

In some embodiments, creating the epitaxial crystalline thin film comprises creating, with use of molecular beam epitaxy, a first undoped buffer epitaxial crystalline thin film that is at least 1 nanometer thick and that is on top of the substrate; applying a mask on top of the first undoped buffer epitaxial crystalline thin film, wherein the mask covers a first portion of the first undoped buffer epitaxial crystalline thin film and does not cover a second portion of the first undoped buffer epitaxial crystalline thin film; creating, with use of molecular beam epitaxy, a doped epitaxial crystalline thin film on top of the second portion of the first undoped buffer epitaxial crystalline thin film while the mask covers the first portion of the first undoped buffer epitaxial crystalline thin film, wherein the doped epitaxial crystalline thin film has a doping concentration of the rare-earth ions of less than 100 parts per billion; removing the mask; and creating, with use of molecular beam epitaxy, a second undoped buffer epitaxial crystalline thin film that is at least 1 nanometer thick and that is on top of the doped epitaxial crystalline thin film and on top of the first portion of the first undoped buffer epitaxial crystalline thin film.

In some embodiments, the substrate is silicon, wherein epitaxial crystalline thin film is yttrium oxide, wherein the rare-earth ions are erbium.

In some embodiments, the rare-earth ions are europium, praseodymium, neodymium, or ytterbium.

In some embodiments, at least one erbium atom in the epitaxial crystalline thin film is at least 100 nanometers away from any other erbium atom.

In some embodiments, at least one erbium atom in the epitaxial crystalline thin film is at least 100 nanometers away from any other rare-earth dopant.

In some embodiments, the epitaxial crystalline thin film is one of strontium titanate.

In some embodiments, the method may further include integrating the epitaxial crystalline thin film assembly comprising the epitaxial crystalline thin film into one of a quantum memory device, a quantum information processing device, a quantum electronic device, and a photonic device.

BRIEF DESCRIPTION OF THE DRAWINGS

The detailed description particularly refers to the following figures, in which:

FIG. 15A shows a schematic of a thin film assembly;

FIG. 15B shows a RHEED pattern corresponding to a thin film assembly;

FIG. 15C shows an x-ray diffraction pattern of a thin film assembly;

FIG. 16A shows a cross-sectional TEM of a thin film;

FIG. 16B shows a TEM image of a $Y_2O_3$ film;

FIGS. 17A-17D show cross-sectional TEM images of various thin film assemblies;

FIGS. 17E & 17F show an energy dispersive spectroscopy (EDS) scan of various thin film assemblies;

FIGS. 18A-18C & 18G-18I show x-ray diffraction curves for various thin film assemblies;

FIGS. 18D-18F & 18J-18L show line width plots for various thin film assemblies;

FIG. 19A shows a schematic of energy levels in $Er^{3+}$;

FIG. 19B shows electron paramagnetic resonance spectra of erbium;

FIG. 19C shows photoluminescence spectra from $Er:Y_2O_3$ films;

FIG. 20A shows film thickness and disorder of film versus linewidth;

FIG. 20B shows a linewidth measurement of one embodiment; and

FIG. 20C shows an optical excitation decay rate measurement of one embodiment.

DETAILED DESCRIPTION OF THE DRAWINGS

Figure 1:
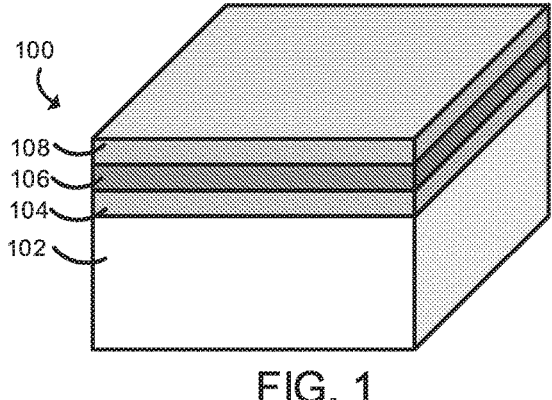
FIG. 1 is a perspective view of one embodiment of a thin film assembly.

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

Referring now to FIG. 1, an illustrative thin film assembly 100 has a substrate 102, a first undoped epitaxial crystalline buffer thin film 104, a doped epitaxial crystalline thin film 106, and a second undoped epitaxial crystalline buffer thin film 108. The doped epitaxial crystalline thin film 106 is doped with a rare-earth ion, such as erbium. In the illustrative embodiment, each of the first undoped epitaxial crystalline buffer thin film 104, the doped epitaxial crystalline thin film 106, and the second epitaxial crystalline undoped buffer thin film 108 is made of the same crystalline host, such as yttrium oxide ($Y_2O_3$) and the rare earth ion dopant is erbium. The epitaxial crystalline structure of each thin film 104, 106, 108 ensures that the environment of the dopants is uniform, reducing stray electrical and magnetic fields and increasing the coherence time of transitions in the 4f-4f shell in the dopants of the doped epitaxial crystalline thin film 106. The presence of the buffer thin films 104, 108 increase the isolation of the dopants in the doped thin film 106, further increasing the coherence time of transitions of the dopants.

In the illustrative embodiment, the substrate 102 is silicon. In particular, in one embodiment, the silicon is prepared in a [111] crystal orientation with a 7×7 surface reconstruction. In some embodiments, substrates other than Si [111] may be used. Examples of such substrates include, but are not limited to, Si [100], silicon on insulator (SOI), sapphire, and strontium titanate (STO)

In the illustrative embodiment, each of the first undoped epitaxial crystalline buffer thin film 104, the doped epitaxial crystalline thin film 106, and the second epitaxial crystalline undoped buffer thin film 108 is yttrium oxide. Yttrium oxide has several benefits. The lattice mismatch between a silicon substrate 102 and yttrium oxide is small, reducing strain and improving epitaxial growth. Yttrium oxide does not have any unpaired electrons, reducing one source of magnetic noise. Yttrium only has one stable isotope, leading to a uniform distribution of nuclear spin of H from the rare-earth ion in the host crystal. When considering erbium as a dopant, yttrium oxide is a good option as yttrium is isovalent as an erbium dopant and has a similar Shannon radius.

In some embodiments, in the crystalline host for the layers 104, 106, 108 a fraction of the yttrium in the yttrium oxide is replaced with lanthanum in each thin film 104, 106, 108. The fraction could be, for example, 10-25%, of the yttrium atoms. The crystalline host is thus is ($La_xY_{1-x})_2O_3$ in these embodiments. The replacement of yttrium with lanthanum can reduce the lattice mismatch with a silicon substrate 102. However, experimental results indicate that the presence of lanthanum increases the inhomogeneous optical linewidth, even though the crystal structure is improved by the presence of the lanthanum. Therefore, in some embodiments, the crystalline host for the layers 104, 106, 108 is lanthanum-free with x=0 in ($La_xY_{1-x})_2O_3$. In some embodiments illustrated herein, the yttrium source used for molecular beam epitaxial growth of yttrium oxide has fewer than 10 ppm of lanthanum thereby allowing the formed yttrium oxide films to have even fewer lanthanum impurities due to the relative differences in the vapor pressures of lanthanum and yttrium.

It should be appreciated that, in some embodiments, a different host crystal may be used. For example, in some embodiments, the host crystals in the thin films 104, 106, 108 may be a different rare-earth oxide, titanium dioxide ($TiO_2$), strontium titanate ($SrTiO_3$), etc.

The doped epitaxial crystalline thin film 106 may be any suitable thickness, such as anywhere from a single monolayer up to one micrometer. In the illustrative embodiment, the dopant concentration is low enough that at least some of the dopants can be treated as isolated dopants. For example, in the illustrative embodiment, at least some of the dopants are separated from every other dopant by at least 100 nanometers. In such embodiments, the dopant concentration may be relatively low, such as any concentration from 10 parts per billion to 1,000 parts per billion. As used herein, atomic concentration measured in "parts per billion" or similar language refers to the number of the specified atom in the crystal structure relative to the total number of atoms in the crystal structure. It should be appreciated that the use of epitaxial growth methods allows for control of the dopant concentration even down to dopant levels well below one part per million in a single crystal structure. In some embodiments, the dopants in the doped epitaxial thin film 106 may be not be uniformly distributed in a plane but may be spatially distributed in a particular pattern, as discussed below in more detail in regard to FIGS. 7-14.

In the illustrative embodiment, the dopant in the doped epitaxial crystalline thin film 106 is erbium. Experimental fabrication of the illustrative embodiment of the thin film assembly has shown optical transitions lifetimes of 8.1 milliseconds, which is close to the best measurements in bulk crystals of 8.5 milliseconds. The linewidth of spin transitions were measured to be as low as 7.9 gigahertz at cryogenic temperatures. Additionally or alternatively, in some embodiments, other rare-earth ion dopants may be used, such as europium, neodymium, praseodymium, ytterbium, etc.

The illustrative embodiment of the thin film assembly 100 includes a first buffer thin film 104 and a second buffer thin film 108. The first buffer thin film 104 isolates dopants in the doped thin film 106 from the substrate 102 and from any disordered region at the transition from the substrate 102 to the host crystal. The second buffer thin film 108 isolates the dopants in the doped thin film 106 from the upper surface and environment, including isolation from air after fabrication and prior to use. In the illustrative embodiment, each of the first buffer thin film 104 and the second buffer thin film 108 is at least 100 nanometers thick. It is contemplated that the second buffer thin film could have a fourth layer formed thereon instead of being exposed to the environment, in which case, the second buffer thin film isolates the rare earth dopants of the doped thin film 106 from the interface between the second buffer thin film 108 and the fourth layer. More generally, each of the first buffer thin film 104 and the second buffer thin film 108 may be any suitable thickness, such as 5-2,000 nanometers. In some embodiments, the thin film assembly 100 may not include the first buffer thin film 104 and/or the second buffer thin film 108.

It should be appreciated that, in some embodiments, single ions in the thin film assembly 100 (or other thin film assemblies described elsewhere in the present specification) may be integrated into, form a part of, or otherwise interface with a quantum information system. For example, single ions may be used as part of a quantum transducer, may be used as qubits, may be used as part of a quantum computer, may be used as part of a quantum information processing device, may be used as part of a quantum cryptography system, etc. In such embodiments, dopant ions may be isolated from each other to such that single ions can be addressed using, e.g., optical signals.

Figure 2A:
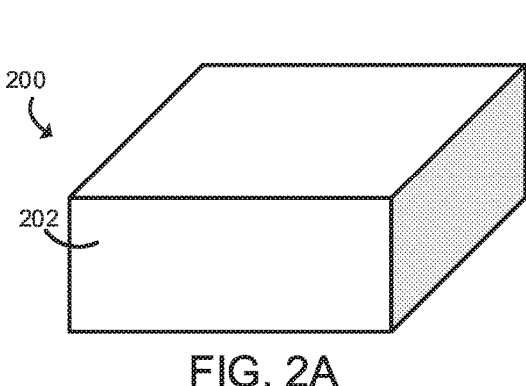
FIGS. 2A-2B are perspective views of various stages of fabrication of the thin film assembly of FIG. 2A.
Figure 2B:
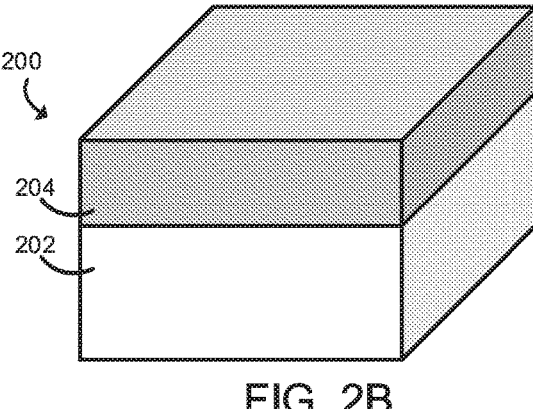
Figure 3:
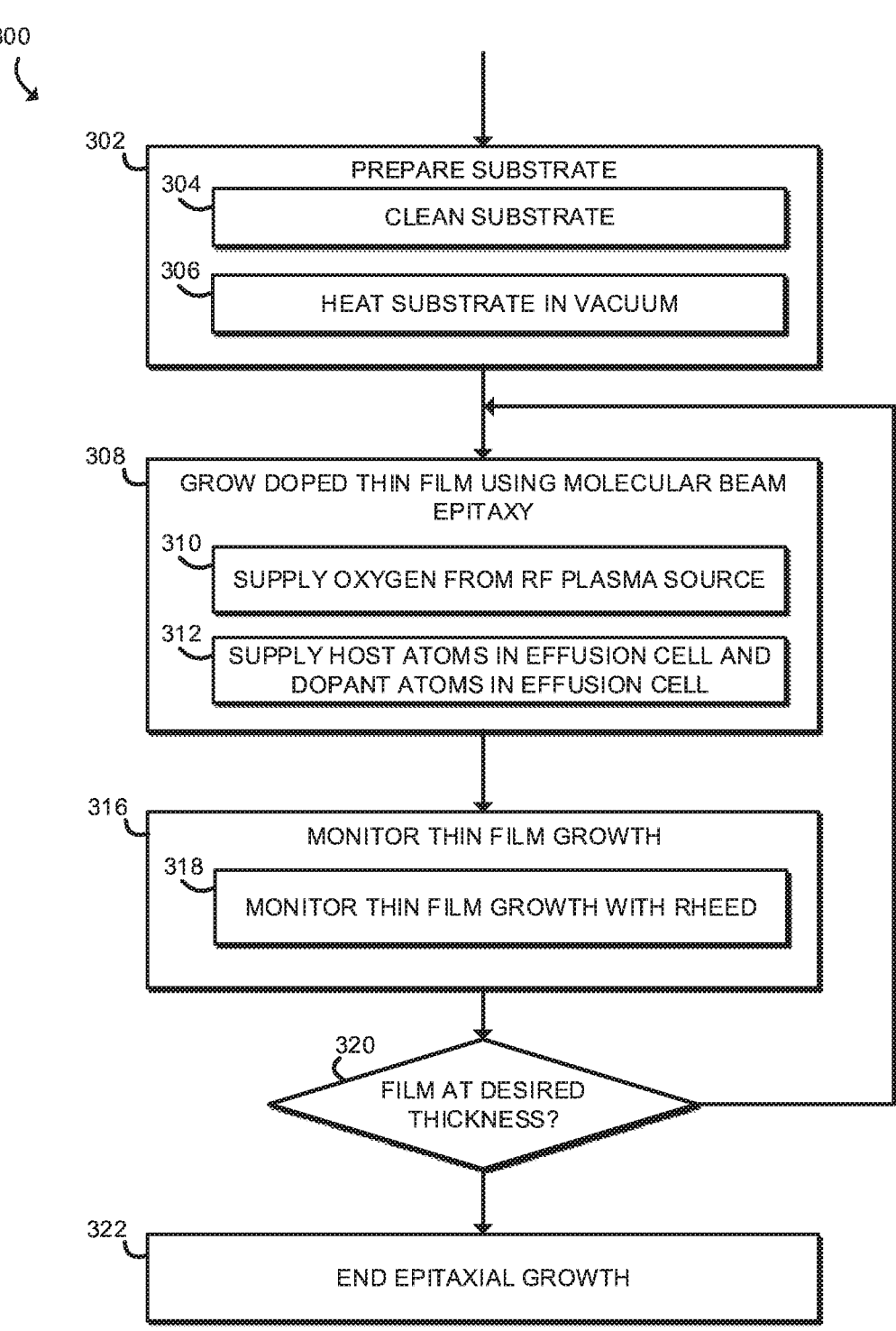
FIG. 3 is a simplified flow diagram of one embodiment of a method for the fabrication of the thin film assembly shown in FIGS. 2A-2B.

Referring now to FIGS. 2A, 2B, and 3, in one embodiment, a method 300 in FIG. 3 describes a fabrication of a thin film assembly 200 as show in FIGS. 2A & 2B. The method 300 begins in step 302, in which a substrate 202 is prepared, as shown in FIG. 2A. In the illustrative embodiment, the substrate is a silicon substrate 202 in a [111]

crystal configuration with a 7×7 surface reconstruction. In step 304, the substrate 202 is cleaned. In the illustrative embodiment, a piranha clean is used following by a dilute hydrofluoric acid clean. Additionally or alternatively, any suitable cleaning technique may be used. The substrate 202 is then heated in a vacuum. In the illustrative embodiment, the substrate 202 is heated to 650° Celsius for 30 minutes, transferred to the growth chamber, heated at a rate of 200° Celsius/minute to 1,100° Celsius, where it is held for 30 seconds, and then brought back down at 200° Celsius/ minute to the growth temperature, which may be, e.g., 600-950° Celsius.

The method 300 proceeds to step 308, in which a molecular beam epitaxy (MBE) system is used to grow a doped thin film. The illustrative MBE system has a chamber that can be maintained under ultra-high vacuum conditions, such as a vacuum of less than $10^{-10}$ Torr. The vacuum can be maintained using a combination of pumps, such as a turbopump and a cryopump. In the illustrative embodiment, a substrate can be suspended from the top and includes a substrate heater for heating the suspended substrate. The substrate can be mounted on a rotation mechanism. The material is generally supplied from heated pure metal sources using effusion cells or from gated heated sources for volatile precursor compounds. The MBE system in the illustrated embodiment includes effusion cells having automated shutters with sub-second response times to control deposition. In the illustrative embodiment, high purity sources are used for the effusion cells of both the host atoms and dopant atoms, such as >99.99% purity with less than 10 ppm concentration of impurities from other rare-earth elements. The UHV chamber also has one or more inlets and associated gas flow apparatus for controllable flow of gases, such as oxygen and the like, into the UHV chamber. The timing and flow rate of gases can be controlled according to the desired composition of the epitaxial films being grown. It should be appreciated that, in some embodiments, the MBE system may have different components than those described herein.

In the illustrated embodiment, initially, the pressure in the chamber is less than $10^{-9}$ Torr. In step 310, oxygen is suppled from an RF plasma source. The oxygen flow rate may be any suitable rate, such as 1 to 4.5 standard cubic centimeters per second. In the illustrative embodiment, the oxygen flow is 2.8 standard cubic centimeters per second. With oxygen flowing, the chamber pressure is $8 \times 10^{-6}$ to $2 \times 10^{-5}$ Torr, depending on oxygen flow rate.

In step 312, the MBE system provides host atoms (such as yttrium for a host crystal of yttrium oxide) and dopant atoms (such as erbium) from respective effusion cells simultaneously while the oxygen is being supplied from the RF plasma source. The flux of the host atoms and dopant atoms can be controlled by controlling the temperature of the corresponding effusion cell. For example, the erbium effusion cell can have its temperature controlled from 5000 Celsius to 900° Celsius to give a concentration from 10 parts per million to 1 part per billion. Of course, it should be appreciated that the flux of the host atoms is far higher than the flux of the dopant atoms. In the illustrative embodiment, high purity sources are used for the effusion cells of both the host atoms and dopant atoms, such as >99.99% purity with less than 0.001% concentration of impurities from other rare-earth elements.

The MBE system monitors the thin film growth (step 316). In the illustrated embodiment, the thin film growth is monitored with use of reflection high-energy electron diffraction (RHEED) which uses high energy electrons at a small incidence angle to investigate the top few atomic layers of the film. The patterns made by these reflected electrons provide information about the characteristics of the top layers of film, for example, whether the layers are single crystal, polycrystalline or amorphous material. However it should be understood that any suitable technique can be used for thin film characterization and measurement. For example, in some embodiments, an ellipsometer may be used to measure the thickness of the thin film. Additionally or alternatively, in some embodiments, a growth rate may be monitored by monitoring parameters of the MBE system such as pressure, substrate temperature, effusion cell temperature, etc. The thin film growth can be monitored continuously or periodically.

In step 320, if the epitaxial thin film has not reached the desired thickness, the method 300 loops back to step 308 to continue epitaxial growth. If the epitaxial thin film has reached desired thickness, the method 300 proceeds to step 320, in which the epitaxial growth is ended. The epitaxial growth of the thin film assembly 200 is then complete, as shown in FIG. 2B.

In some embodiments, after epitaxial growth is complete, the thin film assembly 200 (or other thin film assemblies described in other portions of the present specification) may undergo additional processing. For example, in some embodiments, the thin film assembly 200 may be annealed, such as by annealing the thin film assembly 200 at 300-700° Celsius for 5-60 minutes.

Figure 4A:
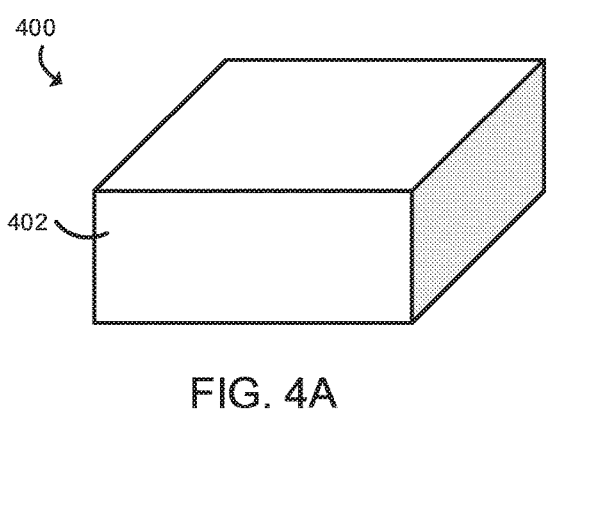
FIGS. 4A-4D are perspective views of various stages of fabrication of one embodiment of a thin film assembly with a rare-earth doped layer.
Figure 4B:
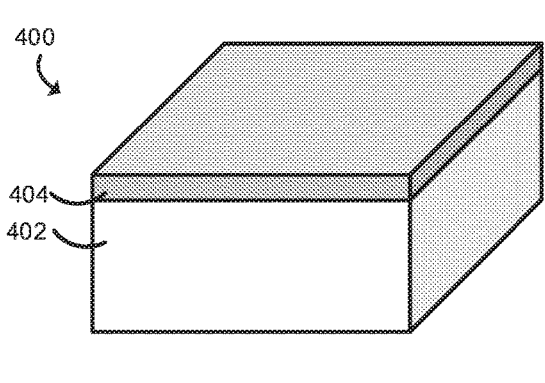
Figure 4C:
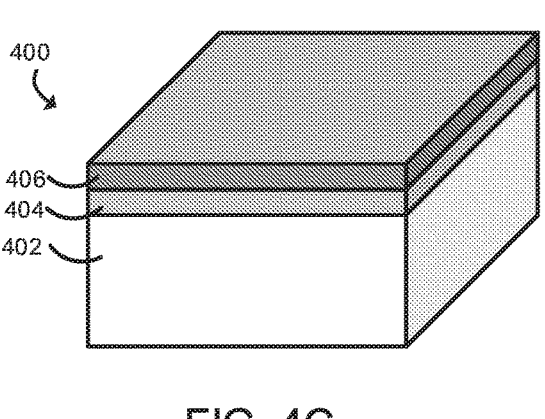
Figure 4D:
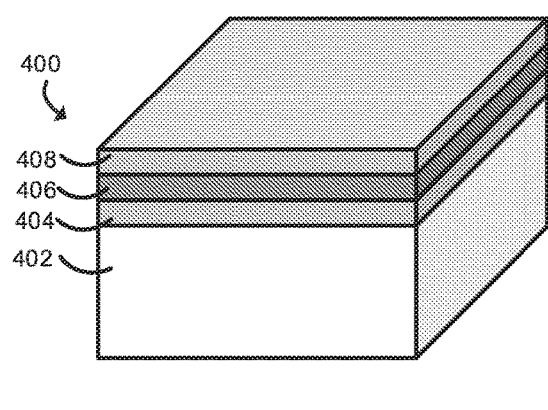
Figure 5:
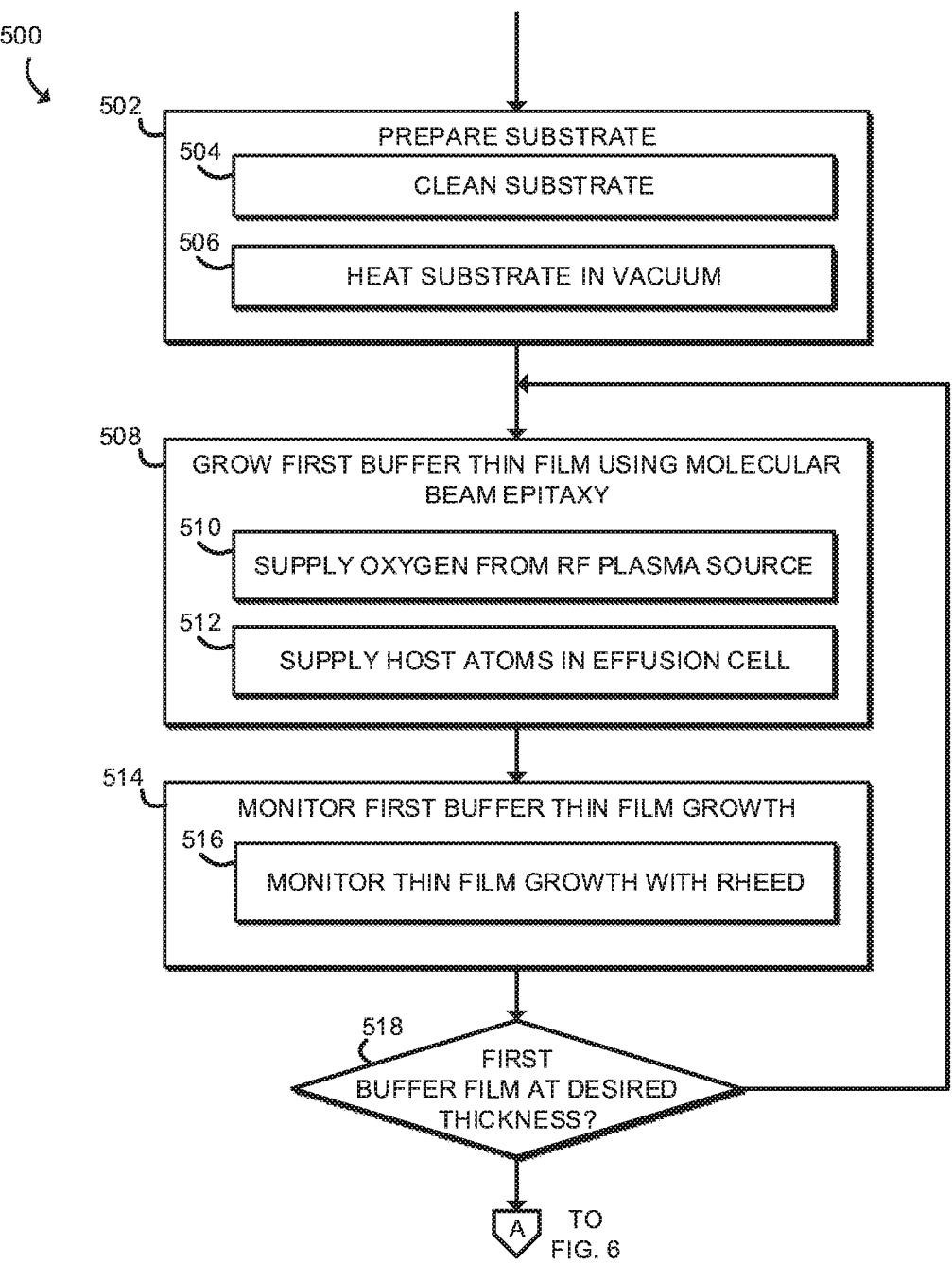
FIGS. 5 & 6 are simplified flow diagrams of one embodiment of a method for the fabrication of the thin film assembly shown in FIGS. 4A-4D.
Figure 6:
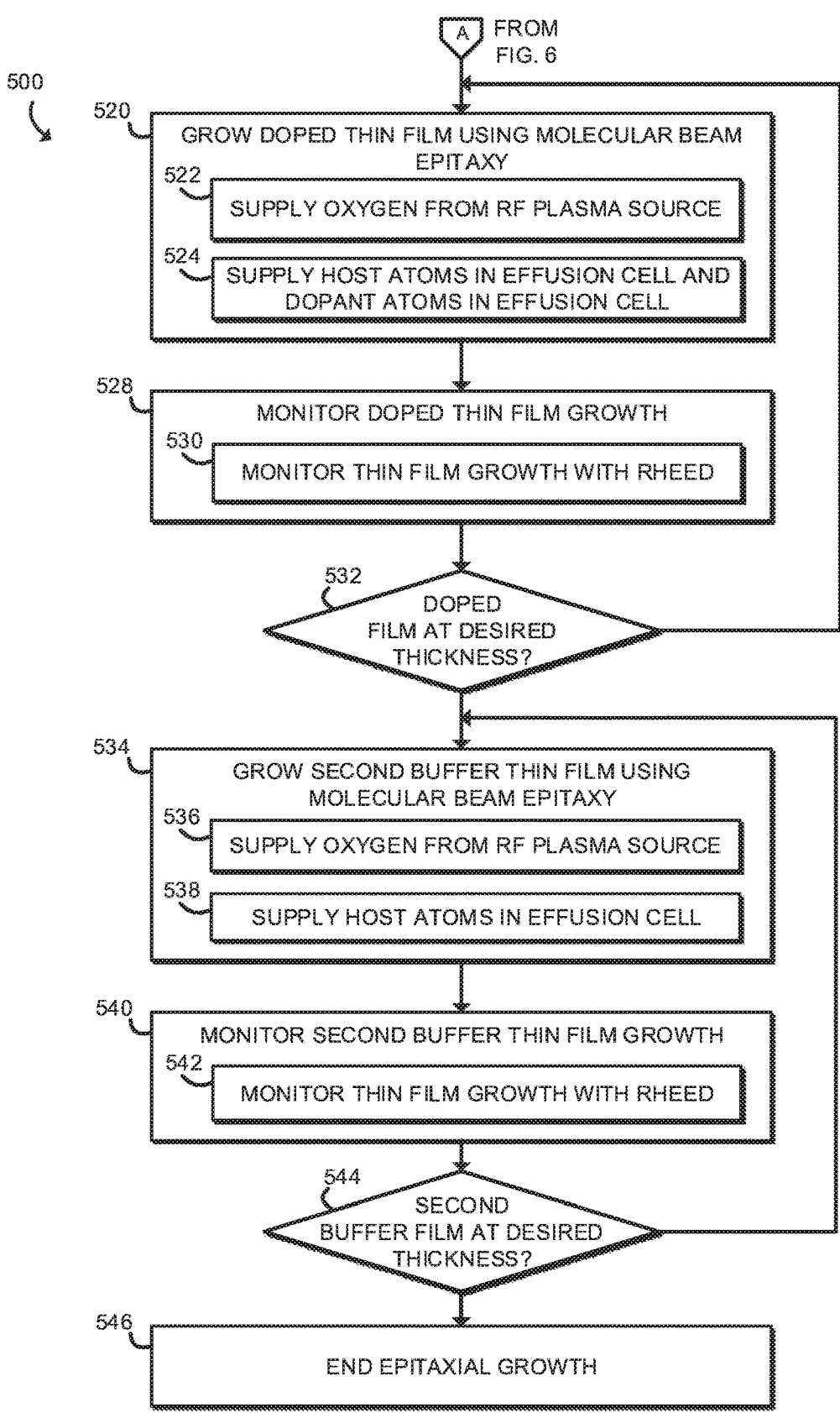

Referring now to FIGS. 4A-4D and 5-6, in one embodiment, a method 500 in FIGS. 5-6 describes a fabrication of a thin film assembly 400 as show in FIGS. 4A-4D. The method 500 begins in step 502, in which the substrate 402 is cleaned, shown in FIG. 4A. Steps 502-506 are similar to steps 302-306 of the method 300, which will not be repeated in the interest of clarity.

In step 508, the molecular beam epitaxy system is used to grow a first buffer thin film 404 on the substrate, as shown in FIG. 4B. The first buffer thin film 404 is grown in a similar manner in steps 508-518 as the doped thin film 204 in steps 308-320 of the method 300, except that no dopant atoms are supplied (e.g., the effusion cell with the dopant atom is left shuttered).

After the growth of the first buffer thin film 404 is complete, the method 500 proceeds to step 520 in FIG. 6, in which a doped thin film 406 is grown, as shown in FIG. 4C. In steps 520-532, the doped thin film is grown in a similar manner as the growth (steps 508-518) of the first buffer thin film, except the molecular beam epitaxy system additionally supplies dopant atoms from an effusion cell. As described above, the flux of the dopant atoms can be controlled by controlled the temperature of the effusion cell. It should be appreciated that, in some embodiments, the supply of dopant atoms can be turned on and off rapidly, allowing for as little as a single monolayer of a doped thin film 406. In the illustrative embodiment, the supply of dopant atoms is controlled by a shutter, which can be controlled either by software or manually.

After the doped thin film 406 is grown, the method 500 proceeds to steps 534-544, in which a second buffer thin film 408 is grown, which is done in a similar manner as the first buffer thin film 404 is grown in step 520-532. The epitaxial growth is then ended at step 546. The thin film assembly 400 after the epitaxial growth is complete is shown in FIG. 4D.

Figures 7A, 7B, 7C, 7D, 7E, 7F, 7G:
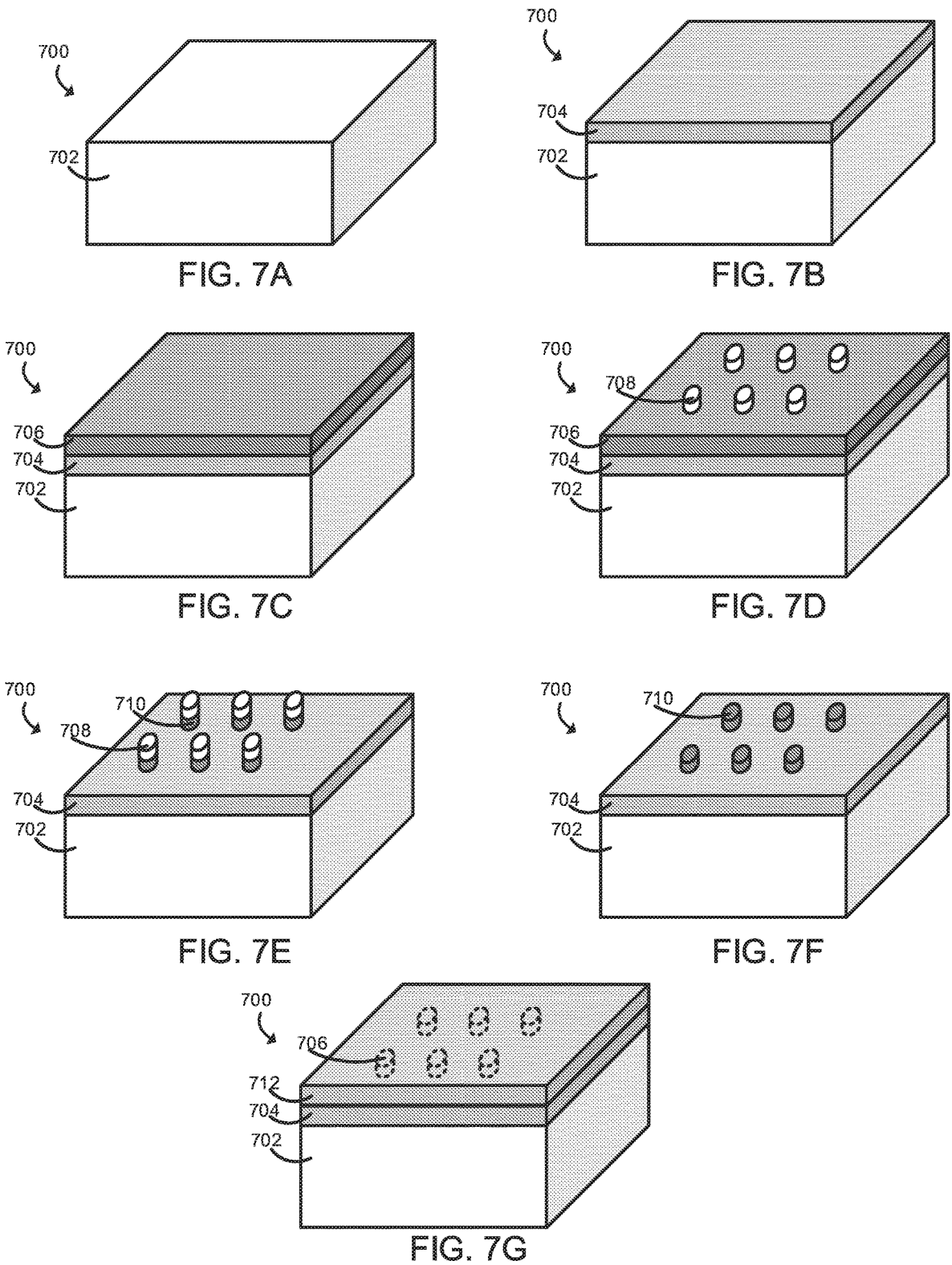
FIGS. 7A-7G are perspective views of various stages of fabrication of another embodiment of a thin film assembly with a rare-earth doped layer.
Figure 8:
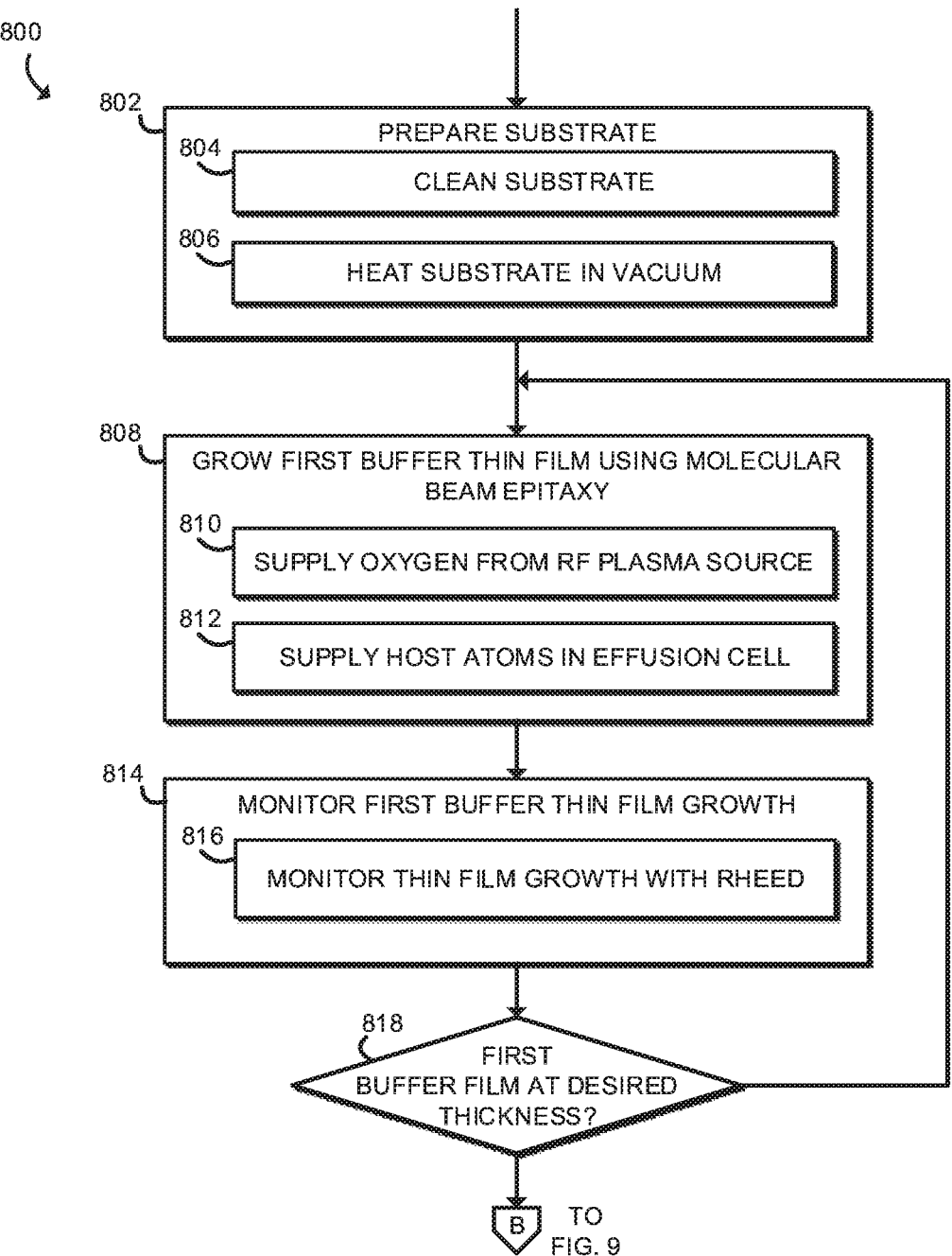
FIGS. 8-10 are a simplified flow diagram of one embodiment of a method for the fabrication of the thin film assembly shown in FIGS. 7A-7G.
Figure 9:
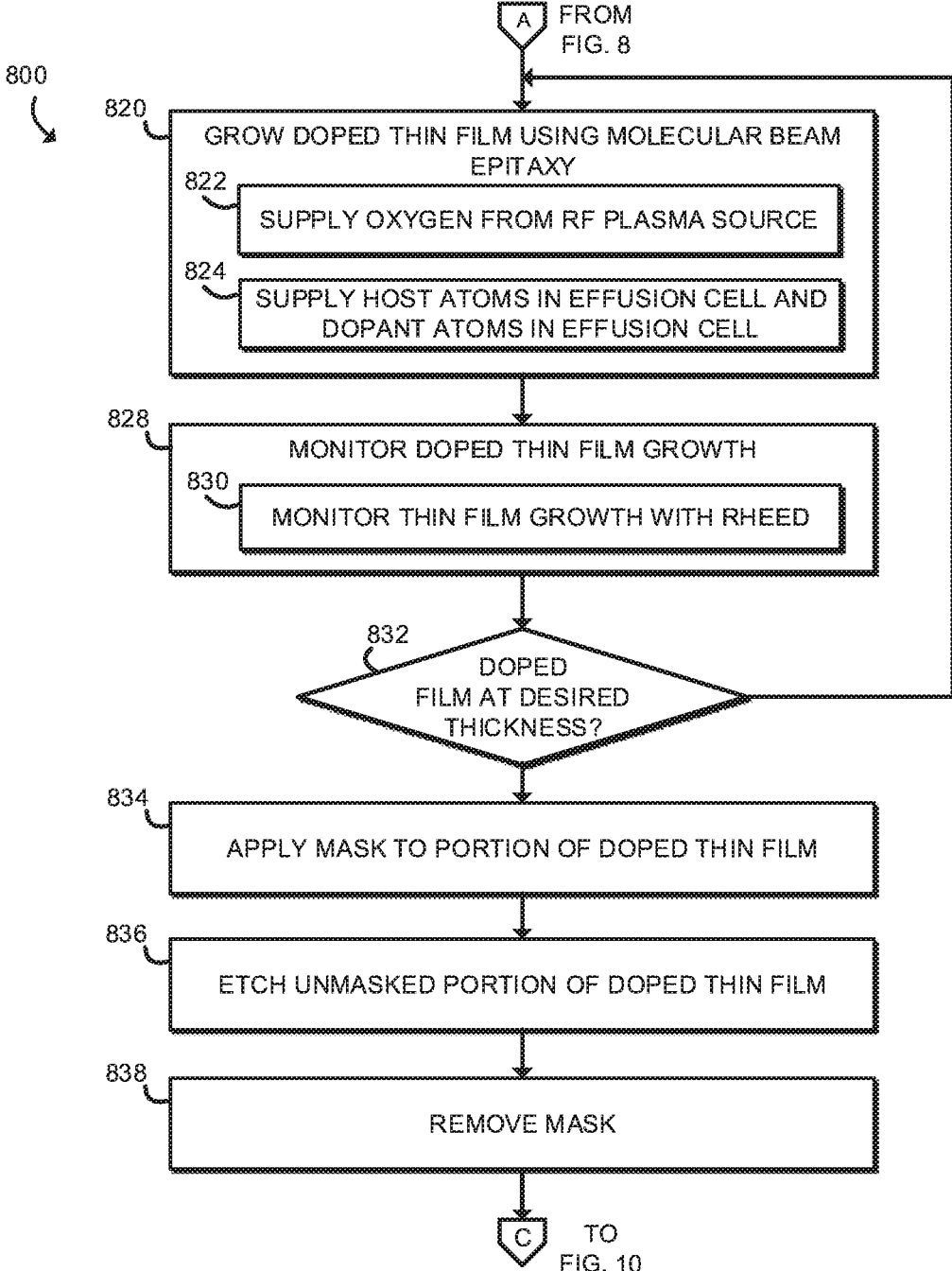
Figure 10:
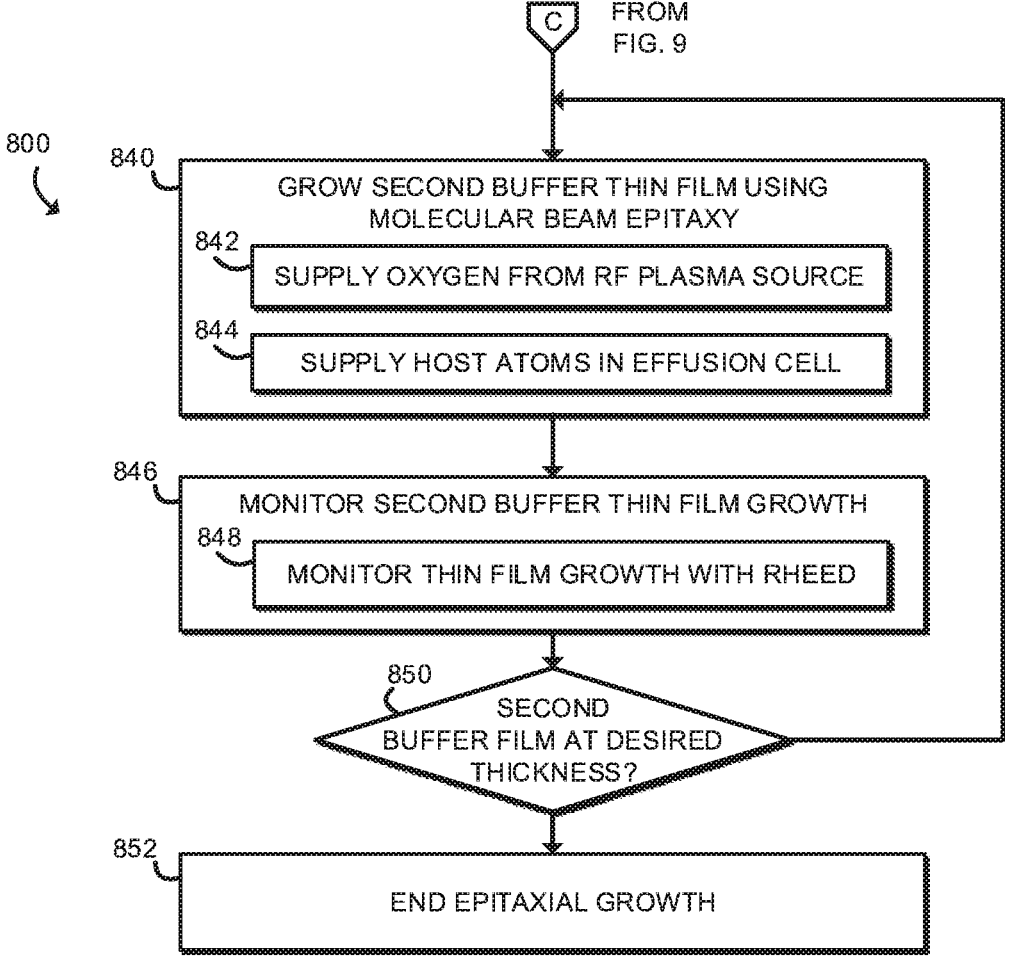

Referring now to FIGS. 7A-7G and 8-10, in one embodiment, a method 800 in FIGS. 8-10 describes a fabrication of a thin film assembly 700 as show in FIGS. 7A-7G. The method 800 begins in step 802, in which the substrate 802 is cleaned, shown in FIG. 8A. A first buffer thin film layer

704 is then grown on the substrate in steps 808-818, as shown in FIG. 8B. Referring now to FIG. 9, a doped thin film layer 706 is then grown on the substrate in steps 820-832, as shown in FIG. 8C. Steps 802-832 are similar to steps 502-532 of the method 500, which will not be repeated in the interest of clarity.

In step 834, a mask 708 is applied to a portion of the doped thin film 706, as shown in FIG. 7D. In the illustrative embodiment, the mask 708 covers regions of the doped thin film 706 that should be left in place to form isolated regions of the doped thin film 706. Any suitable mask 708 may be used to define the regions of the doped thin film 706 that should be left in place. For example, in one embodiment, a mask 708 may be formed by depositing a layer of chromium, silicon dioxide, or silicon nitride that is then patterned using appropriate lithographic techniques. The mask material may be deposited using sputtering, chemical vapor deposition, electron beam evaporation, or any other suitable technique. The mask 708 may be any suitable thickness, such as anywhere from a few nanometers to one micron. It should be appreciated that, in the illustrative embodiment, the mask formation occurs outside the MBE growth chamber and the partially formed thin film assembly 700 is removed from the MBE chamber for mask deposition and patterning and then reinserted.

The mask 708 may define regions of any suitable size or shape, such as circles with 5-100 nanometer diameters. The mask 708 may define any suitable number of regions, limited only by factors such as the complexity of the mask 708 to be placed on the thin film assembly 700 and the dimensions of the thin film assembly 700.

In step 836, the unmasked portion of the doped thin film 706 is etched away, leaving doped regions 710 with the mask 708 on the first buffer thin film 704, as shown in FIG. 7E. In the illustrative embodiment, an etching is done for a predetermined amount of time so that the doped thin film 706 that is not covered by the mask is etched away without etching too much of the first buffer thin film 704. The mask 708 is removed in step 838, leaving the doped regions exposed as isolated structures, as shown in FIG. 7F. The mask 708 can be removed by, e.g., chemically removing the mask 708. For example, a silicon dioxide mask can be removed using a dilute hydrogen fluoride solution and a chromium mask can be removed using a chromium etchant.

Referring now to FIG. 10, a second buffer thin film 712 is grown on top of the doped regions 710 and first buffer thin film 704, enclosing the doped regions 710, as shown in FIG. 7G. It should be appreciated that the doped regions 710 can be very thin, down to a single monolayer. As such, the doped regions 710 may not significantly affect the final surface quality of the second buffer thin film 712. Steps 840-850 in which the second buffer thin film 712 is grown are similar to steps 534-544 in the method 500. The epitaxial growth is then ended in step 852.

Figure 11A:
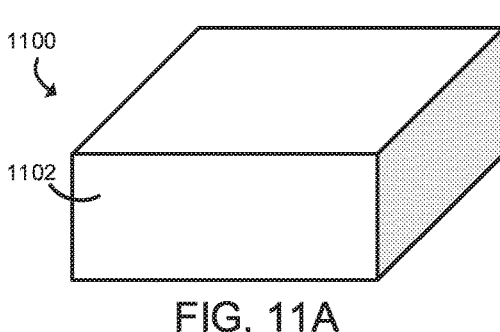
FIGS. 11A-11F are perspective views of various stages of fabrication of one embodiment of a thin film assembly with a rare-earth dopant.
Figure 11B:
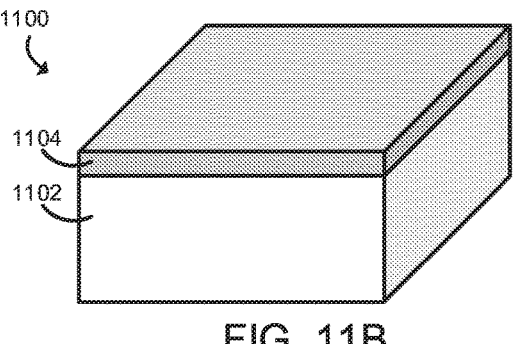
Figure 11C:
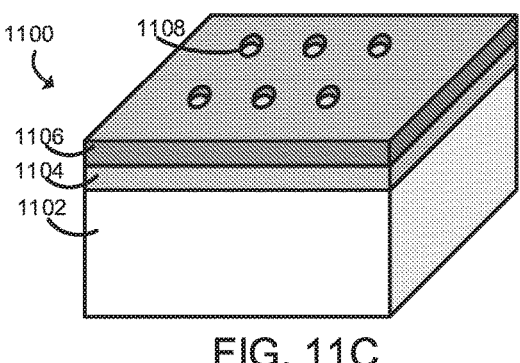
Figure 11D:
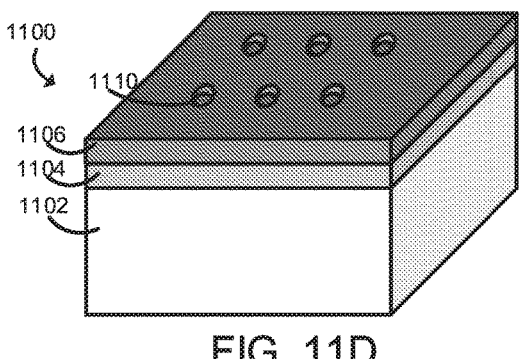
Figure 11E:
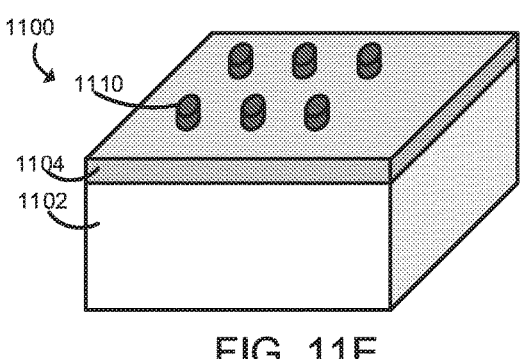
Figure 11F:
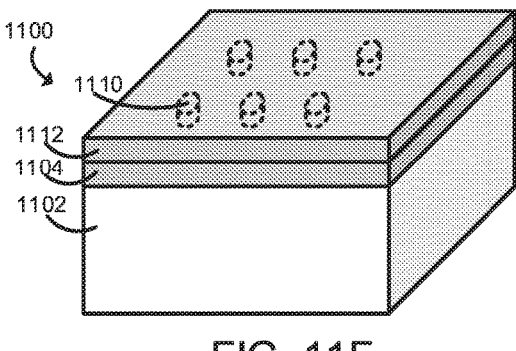
Figure 12:
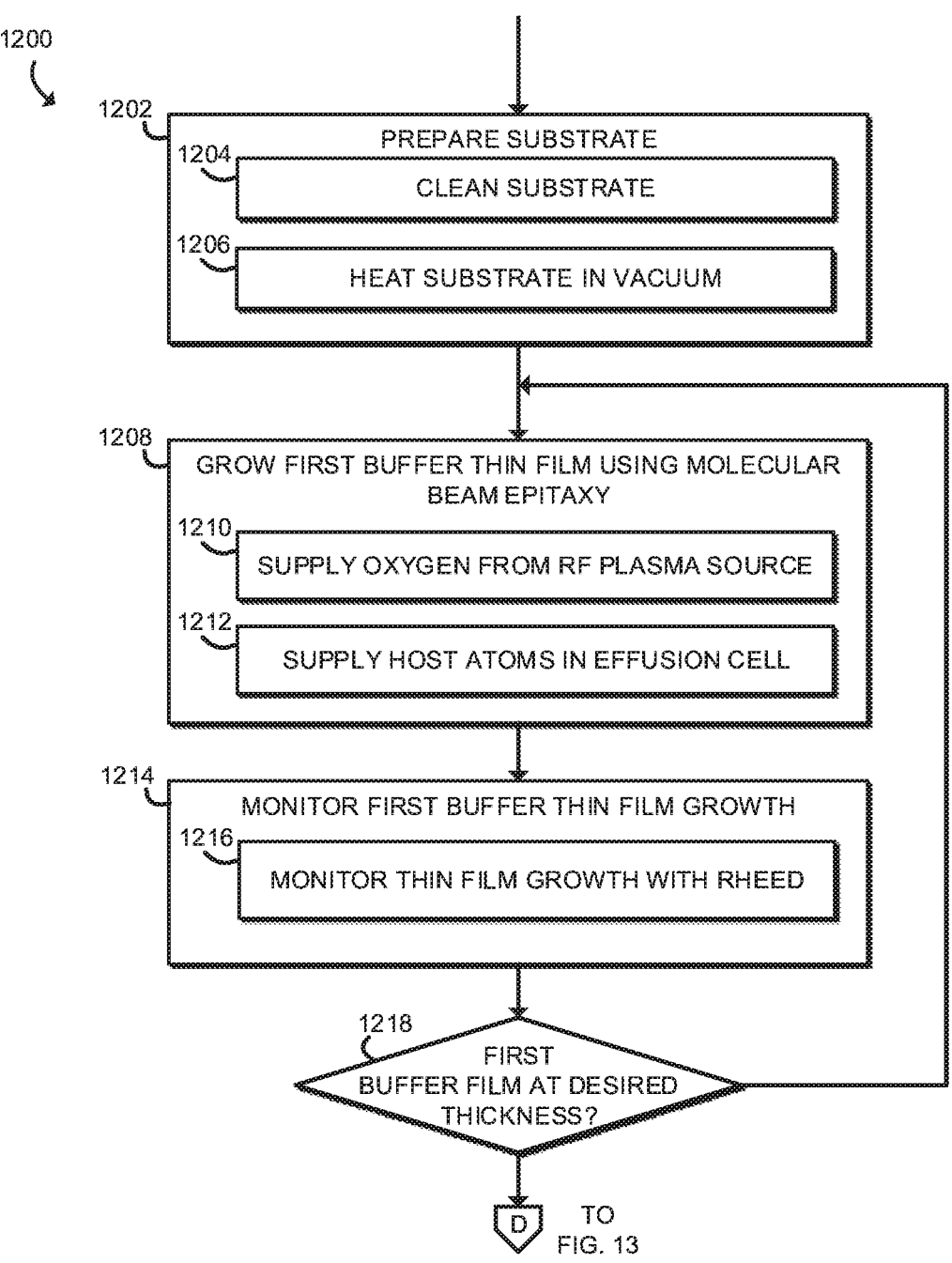
FIGS. 12-14 are a simplified flow diagram of one embodiment of a method for the fabrication of the thin film assembly shown in FIGS. 11A-11F.
Figure 13:
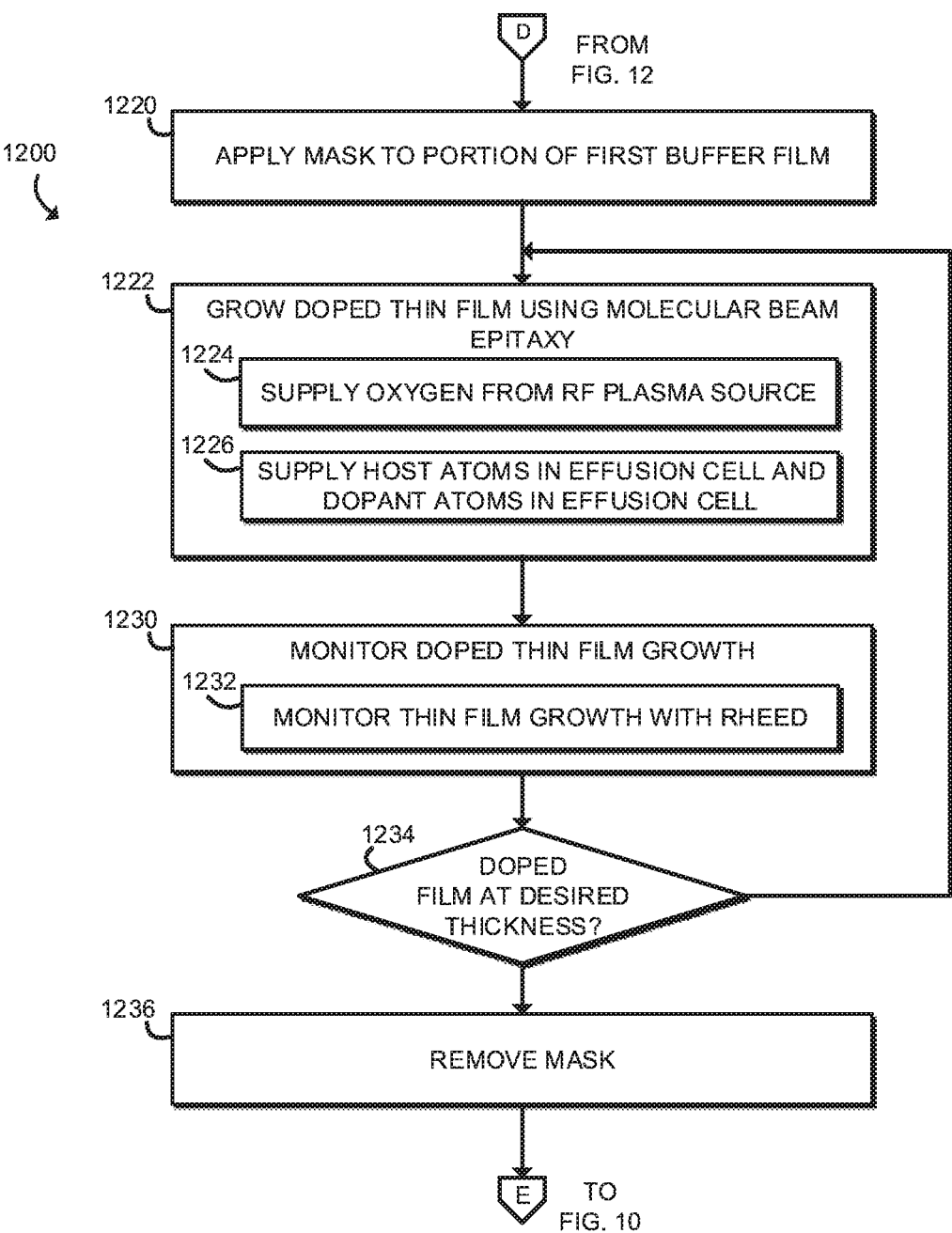
Figure 14:
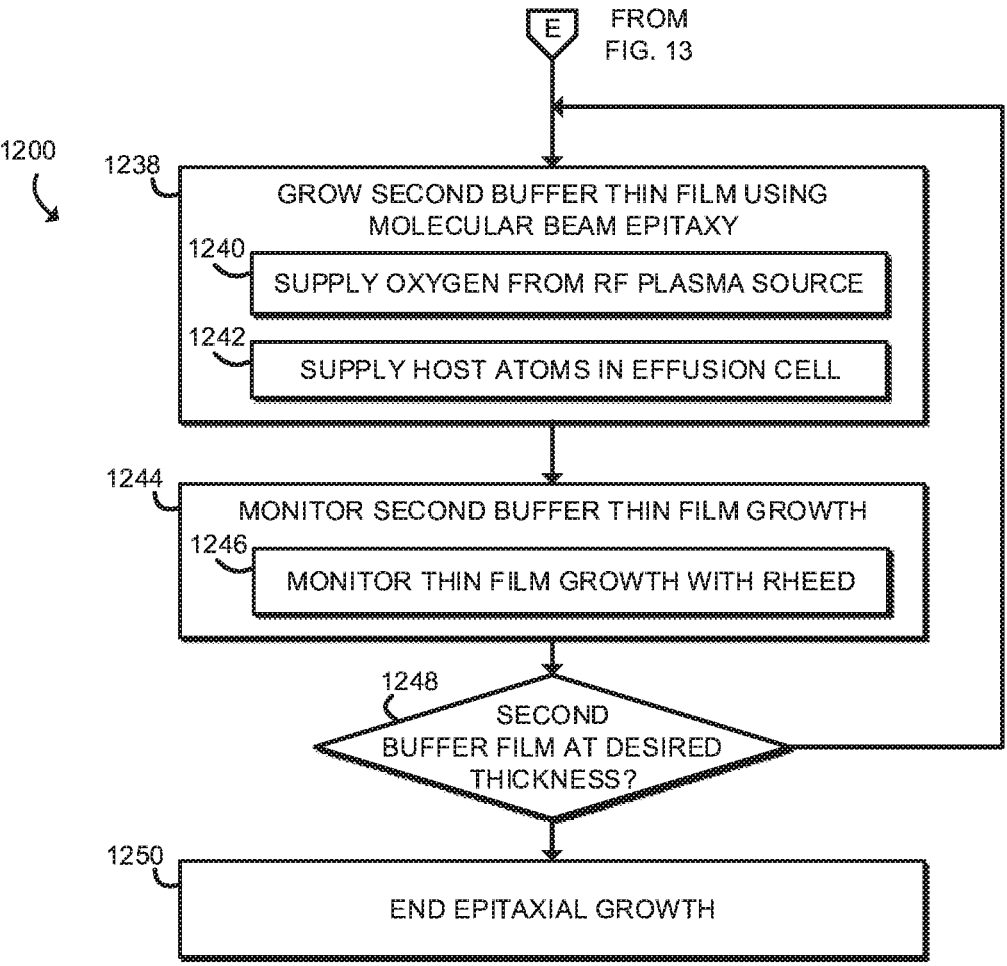

Referring now to FIGS. 11A-11F and 12-14, in one embodiment, a method 1200 in FIGS. 12-14 describes a fabrication of a thin film assembly 1100 as show in FIGS. 11A-11F. The method 1200 begins in step 1202, in which the substrate 1202 is cleaned, as shown in FIG. 11A. A first buffer thin film layer 1104 is then grown on the substrate in steps 1202-1218, as shown in FIG. 11B. Steps 1202-1218 are similar to steps 502-518 of the method 500.

Referring now to FIGS. 13 and 11C, in step 1220, a mask 1106 is applied to a portion of the first buffer film 1104, as shown in FIG. 11C. The mask is formed in a similar manner as discussed above. The mask 1106 defines a pattern of exposed regions 1108 that will have a doped thin film grown on them, blocking the rest of the first buffer film 1104 from growth of the doped thin film. The dimensions, quantity, etc., of the regions 1108 may be similar to that of the regions 710 defined by the mask 708, although the mask 1106 is the inverse of the mask 708. After the mask 1106 is applied, regions 1108 of a doped thin film 1110 are grown inside the regions 1108 as well as on the surface of the mask 1106 (steps 1222-1234), as shown in FIG. 11D. It should be appreciated that the thickness of the doped thin film 1110 is not necessarily the same as the thickness of the mask 1106. Steps 1222-1234 are similar to steps 820-832 in the method 800. The mask is then removed in step 1236 (along with any portion of a thin film deposited on top of the mask) to leave behind a pattern of doped thin film regions, as shown in FIG. 11E. While the patter shown herein is isolated circles, it should be understood that the mask could have any suitable pattern of exposed regions to create the desired patterns of doped regions.

Referring now to FIGS. 14 and 11F, a second buffer thin film 1112 is grown on top of the doped regions 1110 and first buffer thin film 1104, enclosing the doped regions 1110, as shown in FIG. 11F. Steps 1238-1248 in which the second buffer thin film 1112 is grown are similar to steps 840-850 in the method 800. The epitaxial growth is then ended in step 1250.

One example embodiment is described below with reference to FIGS. 15A-20. It should be appreciated that the example described below does not limit other embodiments described herein.

Rare-earth ions have incomplete 4f shells and possess narrow optical intra-4f transitions due to shielding from electrons in the 5s and 5p orbitals, making them good candidates for solid-state optical quantum memory. The emission of $Er^{3+}$ in the telecom C-band (1530 nm-1565 nm) makes it especially attractive for this application. In order to build practical, scalable devices, the REI should to be embedded in a non-interacting host material, preferably one that can be integrated with silicon. It is show herein that $Er^{3+}$ can be isovalently incorporated into epitaxial $Y_2O_3$ thin films on Si (111). We report on the synthesis of epitaxial, single-crystalline $Er:Y_2O_3$ on Si with a narrow inhomogeneous linewidth in the photoluminescence spectra –5.1 GHz (<100 mK) and an optical excited state lifetime of 8.1 ms. The choice of $Y_2O_3$ was driven by its low nuclear spin and small lattice mismatch with Si. Using photoluminescence (PL) and electron paramagnetic resonance, we show that $Er^{3+}$ substitutes for Y in the crystal lattice. The role of interfacial $SiO_x$, diffusion of silicon into the film, and the effect of buffer layers on inhomogeneous PL linewidth are examined. We also find that the linewidth decreased monotonically with film thickness but, surprisingly, exhibits no correlation with the film crystalline quality as measured by the x-ray rocking curve scans suggesting other factors at play that limit the inhomogeneous broadening in $Y_2O_3$ films.

The need for quantum memory devices has been increasingly apparent in networked coherent quantum systems that use an optical quantum communication link within a distributed network of processors, or a secure communication network that uses quantum repeaters. The role of a quantum memory is to store quantum information during entanglement events, and multiple mechanisms and systems for storage have been identified by researchers. A promising and convenient approach among them is to use the spin-optical interfaces of rare-earth ions (REIs). Rare-earth ions have full 5s and 5p orbitals that shield the inner 4f levels from the local environment resulting in narrow 4f-4f electronic transitions. This shielding results in a low spectral diffusion not achievable in other systems such as the nitrogen-vacancy center defects. Additionally, they are well suited for development of coherent microwave to optical transduction. These properties make REIs ideal for solid-state optical quantum memory systems, provided they can be embedded in a sufficiently inert (low nuclear spin and no unpaired electrons) solid-state host material and are capable of being modulated electrically or optically in an efficient manner. Among REIs, $Er^{3+}$ is particularly attractive since it has an optical transition (~1535 nm for $^4I_{13/2} \rightarrow ^4I_{15/2}$) that lies in the telecom C-band ($\lambda$=1530 nm-1565 nm), enabling the use of existing in-ground fiber links, and leveraging the extremely low transmission loss in this wavelength range (0.2 dB/km).

One way of accomplishing scalability and compact operability is via the use of $Er^{3+}$ ions embedded in a thin film solid-state host that can be grown and integrated directly onto a silicon platform, enabling potential integration with silicon photonic components and fabrication of low mode volume, high Q-factor compact resonators, and electronics that will enable us to address the hyperfine states. Evaluation of the optical and microstructural properties of Er doped epitaxial rare earth oxides thin films has not been done before. This is one objective of the current research, and herein, we explore and evaluate the microstructural, chemical and optical properties of $Er^{3+}$ in epitaxial $Y_2O_3$ and $(La_xY_{1-x})_2O_3$ oxide heterostructures on Si wafers for their suitability in scalable quantum memories. The host material is preferred to be single-crystalline to minimize heterogeneous variations in the environment surrounding embedded REI ions that are expected to induce additional spin-lattice, spin-spin relaxation pathways and reduce the optical and spin coherence times. There are a few considerations relevant for the selection of a good host material for optically active REIs—

(i) A cubic host is preferable with low lattice mismatch between the host material and silicon for high-quality epitaxial growth and silicon integration, (ii) Low or zero nuclear and electron spin is preferred in the host material, (iii) Isovalent incorporation of the REI ion at a substitutional site, and (iv) Low optical loss or absorption in the telecom band.

When considering $Er^{3+}$, several rare-earth sesquioxides satisfy criteria (i) and (iii) (small lattice mismatch and isovalence). Among these, the lowest nuclear spin is offered by $Y_2O_3$, $Gd_2O_3$, $Tb_2O_3$ with nuclear spins of 1/2, (0, 3/2) and (0, 3/2) respectively, along with lattice mismatches of −2.4%, −0.48%, and −1.22%. Among these Y possess no unpaired electrons, which could be a source of magnetic noise. Further, the ionic radii of $Y^{3+}$ and $Er^{3+}$ are similar (Shannon radius of 102 pm and 103 pm respectively) and therefore, local strain effects are expected to be minimal. Additionally, as yttrium has only one stable isotope with ½ nuclear spin, it provides a uniform distribution of nuclear spins around $Er^{3+}$ ions. These properties make $Y_2O_3$ an attractive host material for erbium.

Er-doped $Y_2O_3$($Er:Y_2O_3$) and the evaluation of such heterostructures for quantum memory and related devices has remained unexplored. Herein, we demonstrate the successful epitaxial growth of $Er:Y_2O_3$ on Si (111) substrates and carry out a detailed microstructural and optical characterization study of these films. Through careful optimization of the growth conditions, we show that narrow photoluminescence (PL) inhomogeneous linewidths (7.9 GHz at 4K) for the first optical transition of $Er^{3+}$ can be obtained, indicating that $Y_2O_3$ epitaxial films can act as an inert, high quality host for $Er^{3+}$. The hyperfine levels from the 7/2 nuclear spin isotope of Er ($^{167}Er$) can be seen clearly in the Electron Paramagnetic Resonance (EPR) spectrum. We show that the catalytic interfacial oxidation of the $Si/Y_2O_3$ interface, the diffusion of silicon into the oxide layer, and possible diffusion/contamination effects from surfaces are material phenomena that should be controlled and demonstrate how a buffer layer approach can mitigate these effects. No significant correlation between the $Er^{3+}$ PL linewidths and the crystal quality as determined by X-ray rocking curves was observed, indicating that structural distortions due to mosaicity and dislocations in the film may not play a significant role for quantum device development in such heterostructures. On the other hand, we observe a clear inverse correlation between PL linewidth and film thickness, lending further support to the potential role of the proximity of surfaces and interfaces. Finally, we show that alloying this system ($Y_2O_3$) with high quantity of lanthanum, which leads to a closer lattice matching condition, also results in broadening of the PL linewidth.

Epitaxial growths of $Y_2O_3$ thin films were performed on Si (111) substrates in a Riber oxide MBE system with a background pressure of ~$10^{-10}$ torr. Substrates were prepared using a piranha clean followed by a dilute hydrofluoric acid (HF) dip. Epitaxial growth was initiated on 7×7 reconstructed Si (111) surfaces. A range of substrate temperatures between 600° C. to 920° C. was explored for growth. High purity (4N in total metal basis, 5N in rare earth metal basis) erbium, lanthanum and yttrium were evaporated using high-temperature effusion cells and an RF plasma source was used for oxygen (325 W, 2.8 sccm) corresponding to a pressure of ~$2\times10^{-5}$ torr in the growth chamber. Er concentrations between 10 ppm-200 ppm were used for different samples by varying the Er cell temperature between 700° C. and 900° C. respectively. Higher concentration was needed to get a good PL intensity during measurements. We compared the inhomogeneous linewidth for concentrations in this range (10, 50, 200 ppm) and did not find any significant differences. Er concentration was estimated using an $Er_2O_3$ film grown with Er cell temperature of 1200° C. and extrapolating the vapor pressure to lower cell temperatures. The epitaxial growth was monitored in situ with reflection high-energy electron diffraction (RHEED).

$Y_2O_3$ (a=10.60 Å, space group Ia$\bar{3}$, Z=16) has a bixbyite structure with 32 cation ($Y^{3+}$) sites out of which 24 are non-centrosymmetric $C_2$ sites and 8 are centrosymmetric $C_{3i}$ sites. Out of these, there are 6 magnetically inequivalent for $C_2$ and 4 for $C_{3i}$. Given the similar ionic radii, $Er^{3+}$ is expected to substitute for $Y^{3+}$ at both sites during growth.

Ex situ structural characterization was performed using a high-resolution X-ray diffractometer (Bruker D8 Discover). Optical characterization was realized in a confocal microscopy setup. Off-resonant optical spectra were obtained following excitation with a 976 nm laser and the emission detected using a nitrogen-cooled InGaAs camera. Resonant optical spectra for the transition at ~1535 nm were realized using a tunable C-band laser (ID photonics CoBrite DX1) with the photoluminescence (PL) detected using a single nanowire single photon detector (SNSPD, Quantum Opus). In this case, the excitation and the PL signal were temporally isolated from each other using a combination of optical switches and acousto-optic modulators. The samples were mounted on a copper cold-finger in a closed-cycle cryostat (Montana Instruments). All reported measurements in this setup were performed at 4K unless otherwise noted in the text.

A dilution fridge setup is used for the mK measurement and a schematic is provided. The sample is mounted on a three-axis nano-positioner via a copper plate. The laser pulses (Toptica CTL1500) are generated by two tandem acousto-optic modulators (AOMs) with ~100 dB on/off ratio. The pulse sequence with 15 ms pulse width and 10 Hz repetition rate is focused with an aspheric lens pair. The reflected light is collected and delivered to a superconducting nanowire detector (SNSPD) on the cold plate in the same fridge. An optical switch is inserted in front of the SNSPD to step the strong excitation pulse and transmit the emitted light.

X-band EPR was conducted using a Bruker Elexsys E500 system equipped with a variable-temperature cryostat (Oxford). The measurements were performed in a flow cryostat at 4.2 K. The g-factors were calibrated for homogeneity and accuracy by comparison to the $Mn^{2+}$ standard in a SrO matrix (g=2.0012+0.0002)[36] and by using coal samples with g=2.00285±0.00005, respectively.

High-resolution transmission electron microscopy (HR-TEM) was carried out using the Argonne Chromatic Aberration-corrected TEM (ACAT, FEI Titan 80-300ST TEM/STEM) with a field-emission gun and an image corrector to correct both spherical and chromatic aberrations, enabling a resolution limit better than 0.8 Å at an accelerating voltage of 200 kV. High-angle annular dark-field imaging and energy-dispersive X-ray spectroscopy mapping were carried out using a Talos F200X S/TEM (operating at accelerating voltage of 200 kV) equipped with an X-FEG gun and a Super X-EDS system.

FIG. 15(c) shows wide-angle (2θ-ω) X-ray diffraction pattern for a 180 nm film (~140 nm $Er:Y_2O_3$ with 10 ppm Er and with a top cap and bottom buffer each of ~20 nm undoped $Y_2O_3$ as shown in the schematic 1(a)) grown on Si (111) substrate at 850° C. showing $Y_2O_3(222)//Si(111)$ epitaxial relationship. The presence of finite-size thickness (Pendellösung) fringes and streaky RHEED pattern (FIG. 15(b)) suggest smooth and crystalline film.

The crystalline and epitaxial nature of film growth was further studied using transmission electron microscopy (TEM). FIG. 16(a) shows a cross-section transmission electron micrograph of the 460 nm $Y_2O_3$ film grown on Si (111) along with a high-resolution TEM image and a selected area electron diffraction image (inset) of the film consistent with the bixbyite structure of $Y_2O_3$.

The high-resolution TEM image of the film/substrate interface and the energy dispersive spectroscopy (FIG. 17), indicates two amorphous layers. One is caused by Si oxidation at the Si interface. This $SiO_x$ layer transitions to a phase consisting of Y, Si, and O that is proximal to the $Y_2O_3$ film. This is due to the catalytic behavior of rare-earth oxide overlayers that results in silicon oxidation. The interfacial oxidation occurs after epitaxial growth of $Y_2O_3$ via the diffusion of reactive oxygen through the film either during growth or ex-situ. This oxidation can be minimized by reducing the post-growth exposure to oxygen.

We investigated the effect of growth time and temperature on the presence of interfacial oxides and found that the thickness of the amorphous oxide interface increases with increase in growth time and substrate temperature. FIGS. 17(a) to 17(d) show the cross-sectional TEM image and 3(e) and 3(f) show the EDS line scans across the interface for two samples grown at 920° C. and 790° C. for 80- and 60-minutes long growths, respectively. As seen in the scan, the interfacial oxidation leads to the formation of a silicon diffusion tail into the $Y_2O_3$ layer. The width of silicon contaminated zone in $Y_2O_3$ reduces with decrease in growth temperature from 920° C. to 790° C.

In order to further probe the effect of possible silicon diffusion in the film and to examine the role of surface defects on the optical properties of $Er^{3+}$, we studied the photoluminescence for three samples with different structures—400 nm $Er:Y_2O_3/Si$ (FIG. 18a, 18d), 400 nm $Er:Y_2O_3/100$ nm $Y_2O_3/Si$ (FIG. 18b, 18e), and 200 nm $Y_2O_3/400$ nm $Er:Y_2O_3/100$ nm $Y_2O_3/Si$ (FIG. 18c, 18f). Er concentration in these films were kept constant at ~50 ppm level. The inhomogeneous linewidth ($\Gamma_{inh}$) measured from the resonant PL for the first sample was 37.4 GHz (FIG. 18(d)). Insertion of a 100 nm undoped buffer layer decreased the linewidth to 24.0 GHz (FIG. 18(e)). This decrease in PL linewidth is attributed to an increased separation between the active $Er^{3+}$ ions from the film/substrate interface. Further decrease in the PL linewidth was observed when the $Er^{3+}$ ions are away from top interface, condition shown in 4(f). The inhomogeneous linewidth for this sample was found to be 19.6 GHz. This sandwiching of the optically active $Er^{3+}:Y_2O_3$ layer between undoped $Y_2O_3$ helped reduce the inhomogeneous linewidth by about 50%, suggesting that proximity of the interfaces contribute to the broadening seen here. Why does this occur? We believe that the bottom interface and the top surface acts as gateways for impurity diffusion into the $Y_2O_3$ layer. We speculate that these could be trace amounts of Si (from the Si substrate) and/or OH groups and oxygen vacancies (from the top surface exposed to the ambient). Si diffusion is suggested from our EDS scans and oxygen and OH groups are known to be fast diffusing species in ionic oxides. Such impurities could cause inhomogeneous linewidth broadening of the Er emission via localized charge defect formation from aliovalent substitutional, or interstitial accommodation of these impurities or defects in the vicinity of the Er ions.

Due to a large lattice mismatch (2.4% tensile), relaxed $Y_2O_3$ will contain dislocations that relieve the elastic strain. It has been shown earlier that alloying $Y_2O_3$ with La can reduce the lattice mismatch with silicon. To explore the possibility of using a lattice-matched host material for $Er^{3+}$, a 80 nm $(La_xY_{1-x})_2O_3/400$ nm $Er:(La_xY_{1-x})_2O_3/20$ nm $(La_xY_{1-x})_2O_3/Si$ (111) film was grown with x=0, 0.17, and 0.24. Er concentration in these films were kept constant at ~200 ppm level. FIG. 18(g)-(i) shows wide-angle x-ray diffraction pattern for the three sample with varying x. Amongst these samples, the film with x=0.17 had the smallest lattice mismatch (0.37%) with silicon (see SI for details of this estimate). Although this film has lower lattice mismatch compared to the unalloyed film (0.37% vs 2.4%), the inhomogeneous linewidth was found to be 7× larger (FIG. 18(j)-(l)). This broadening is attributed to the presence of random substitutional disorder in the film due to La substituting at the Y site similar to the results reported for Sc alloyed $Er:Y_2O_3$ and $Eu:Y_2O_3$. Increasing the amount of La (x=0.24) further increases the inhomogeneous linewidth due to enhanced disorder as well as phase segregation of hexagonal $La_2O_3$ as evidenced by an additional diffraction peak in the corresponding 2θ-ω scan. The La fraction was estimated by measuring the ratio of beam equivalent pressures of La and Y (using a beam flux monitor).

The presence of $Er^{3+}$ and its incorporation into the crystal structure was supported by EPR measurements and confirmed through the PL data. FIG. 19(b) shows the EPR spectra for a 650 nm $Er:Y_2O_3$ film at 4.2 K (Er concentration ~10 ppm). Naturally occurring Er has multiple isotopes—$^{166}Er$, $^{167}Er$, $^{168}Er$, $^{170}Er$—which constitute 33.50%, 22.87%, 26.98%, 14.91% of naturally occurring erbium, respectively. [167]Er is the only isotope with non-zero nuclear spin (spin=7/2). The contribution from [167]Er is seen as eight smaller peaks in FIG. 19(b) distributed around the main peak at 548.24±0.2 G that comes from the zero nuclear spin isotopes. A schematic is shown in FIG. 19(a). The relative intensities of these peaks are indicative of the abundance of different isotopes. The g-factor calculated for the central peak from the data shown in FIG. 19b is 12.2—and is attributed to be a composite of the contributions coming from the $Er^{3+}$ ion at the $C_2$ sites.

The crystal field effect breaks the spherical symmetry of the free ion and this results in the splitting of the ground state ($^4I_{15/2}$) into 8 Stark levels and the first excited state ($^4I_{13/2}$) into 7 Stark levels—where the number of levels is dictated by the total angular momentum quantum number. Stark levels for the $C_2$ sites are represented as $Z_i$($Z_1$ to $Z_8$) for the split $^4I_{15/2}$ levels and $Y_i$ ($Y_1$ to $Y_7$) for the split $^4I_{13/2}$ levels as shown in FIG. 19(a), and similarly as $Y_i'$ and $Z_i'$ for the $C_{3i}$ sites. FIG. 19(c) shows the PL data collected at 10 K in the wavelength range 1500 nm-1600 nm. Emission peaks in this range is due to transitions between the Stark level manifold of the first excited state ($^4I_{13/2}$) and the ground state ($^4I_{15/2}$). Using data reported in literature, the PL peaks at 1535.6±0.01 nm, 1544.9±0.04 nm, 1554.2±0.1 and 1575.1±0.3 nm can be identified as the $Y_1\rightarrow Z_1$, $Y_1\rightarrow Z_2$, $Y_1\rightarrow Z_3$ and $Y_1\rightarrow Z_5$ transition at the $C_2$ cite. The peak at 1557.3±0.3 nm is identified as coming from the $Y'_1\rightarrow Z'_2$ transition at the $C_{3i}$ site. This indicates that $Er^{3+}$ is substituting for $Y^{3+}$ in the crystal lattice.

FIG. 20(a) shows X-ray rocking curve full width at half maxima (Δω) (indicative of crystalline quality) and the film thickness as a function of the photoluminescence linewidth, $\Gamma_{inh}$. Films shown here have a bottom buffer and top cap in the range of 0-200 nm. Some of the films reported in FIG. 20(a) were grown specifically to check the thickness effect. The 1.8 um film was unique in having a bottom buffer of ~1 um. The erbium concentration for all these films is ≤200 ppm. The data shows no clear correlation between the crystalline quality of the film and $\Gamma_{inh}$. This suggests that the optical properties of $Er^{3+}$ in the $Y_2O_3$ host might not be limited by variations in lattice strain and the presence of growth defects such as dislocations in the host. This trend is unlike what is typically observed in band edge related emission in semiconductors, where poor crystal quality results in poor band edge photoluminescence. On the other hand, the plot of films thickness versus $\Gamma_{inh}$ shows a strong inverse trend—thicker layers result in narrower photoluminescence linewidths. We attribute this to isolation of an increasing proportion of the active $Er^{3+}$ from the top and bottom interfaces which may result in impurity diffusion, as discussed earlier. Our best PL linewidth for $C_2$ site emission was found to be 7.9 GHz at 4 K and 5.1 GHz at 7 mK (base plate temperature on which the sample is mounted) as shown in FIG. 20(b). We estimate that the actual sample temperature from laser heating to be <100 mK (SI). The two measurements of the linewidths were carried out in two different measurement setups in order to gain more confidence in the data. The small difference in linewidths in our view, is most likely due to laser frequency calibration between the two setups and is not significant enough to suggest a temperature dependence of linewidth. In comparison to our thin film results, an inhomogeneous linewidth of 0.42 GHz and 2 GHz have been reported in bulk $Er:Y_2O_3$ polycrystalline (ceramic) and bulk single crystal systems. The optical excitation state decay measured for the PL in our samples was found to be 8.1 ms (shown in FIG. 20(c)) which is comparable to the reported value of 8.5 ms in bulk single crystal and ~6× longer than the lifetime of 1.5 ms reported for $Er:Y_2O_3$ ALD grown thin films. Why are the thin film linewidths broader that those reported in bulk films? In addition to the diffusion of impurities such as hydroxyl ions and silicon from neighboring interfaces, an important factor may be the effect of oxygen vacancies in subsurface regions—these are known charge defects in many ionic oxides.

The rare earth ion, $Er^{+3}$ offers attractive properties suitable for use as a quantum memory: a spin-optical interface, narrow photoluminescence linewidth, low spectral diffusion, and an emission wavelength in the telecom band. This, paired with $Y_2O_3$'s low absorption in that wavelength range and epitaxial compatibility with Si makes $Er:Y_2O_3$ thin films on Si a promising materials platform for quantum technologies. We have successfully demonstrated the growth of $Er:Y_2O_3$ epitaxial thin films on Si(111) and, using spectroscopic techniques demonstrated that the erbium substitutes for yttrium in the bixbyite structure at both the $C_2$ and $C_{3i}$ sites where the optical decay lifetime obtained for the $C_2$ sites is comparable to that of bulk single crystals. We have further carried out a detailed microstructural and optical study of these epitaxial films. We have shown how bottom and top spacer (or buffer) layers can improve the Er photoluminescence linewidths in thin films. We show, importantly, that unlike band-edge-related photoluminescence in semiconductors the photoluminescence of the $Er^{3+}$ emission ($\Gamma_{inh}$) is unaffected by crystal quality as determined by X-ray rocking curve linewidths. However, we show that the photoluminescence linewidths are directly correlated to film thickness indicating surface and interface effects and potential impurity effects related to surfaces/interfaces. Lattice engineering using La leads to improvement in the mismatch with silicon but degrades the $\Gamma_{inh}$ significantly. Finally, we show that by optimizing the epitaxial growth conditions, we can obtain ultra-narrow linewidths of 5.1 GHz in a dilution fridge setup (<100 mK) indicative of high quality $Er^{3+}$ incorporation in a largely non-interacting host. Our next step would be measurement of coherence times on this thin-film system and comparison to values observed in bulk.

It should be appreciated that techniques other than those described above may be used to grow thin film assemblies. For example, in some embodiments, in order to create quantum-dot-like structures shown in FIGS. 7F and 11E, instead of using a mask, a portion of a substrate or film may be roughed, inhibiting epitaxial growth in the roughened portion. Additionally or alternatively, in some embodiments, the temperature of different parts of a substrate or thin film may be controlled, inhibiting or facilitating epitaxial growth on different areas based on temperature.

The invention claimed is:

1. A thin film assembly comprising:

a substrate; and an epitaxial crystalline thin film disposed on the substrate, wherein the epitaxial crystalline thin film comprises a rare-earth oxide, wherein the epitaxial crystalline thin film is a single crystal, wherein at least a portion of the epitaxial crystalline thin film is doped with rare-earth ions;

wherein the epitaxial crystalline thin film comprises:

a first undoped buffer epitaxial crystalline thin film on the substrate;

a doped epitaxial crystalline thin film on the first undoped buffer epitaxial crystalline thin film, wherein the doped epitaxial crystalline thin film is doped with the rare-earth ions at a concentration of less than 100 parts per billion; and a second undoped buffer epitaxial crystalline thin film on the doped epitaxial crystalline thin film;

wherein the first undoped buffer epitaxial crystalline thin film is at least 100 nanometers thick, and the second undoped buffer epitaxial crystalline thin film is at least 100 nanometers thick.

2. The thin film assembly of claim 1, wherein the epitaxial crystalline thin film has a thickness between 200 nanometers and 1,500 nanometers.

3. The thin film assembly of claim 1, wherein the epitaxial crystalline thin film has a thickness less than two microns.

4. The thin film assembly of claim 1, wherein the doped epitaxial crystalline thin film comprises a plurality of doped regions, wherein each of the plurality of doped regions is separated from each other of the plurality of doped regions by at least 100 nm.

5. The thin film assembly of claim 1, wherein the substrate is silicon, wherein epitaxial crystalline thin film is yttrium oxide, wherein the rare-earth ions are erbium.

6. The thin film assembly of claim 1, wherein the rare-earth ions are europium, praseodymium, neodymium, or ytterbium.

7. The thin film assembly of claim 1, wherein the epitaxial crystalline thin film is strontium titanate.

8. The thin film assembly of claim 1, wherein the thin film assembly is integrated into one of a quantum memory device, a quantum information processing device, a quantum electronic device, and a photonic device.

\*    \*    \*    \*    \*